US009165974B2

(12) United States Patent
Kim et al.

(10) Patent No.: US 9,165,974 B2
(45) Date of Patent: Oct. 20, 2015

(54) ELECTRONIC DEVICES INCLUDING MULTIPLE SEMICONDUCTOR LAYERS

(71) Applicant: Samsung Electronics Co., Ltd., Suwon-si (KR)

(72) Inventors: Sung-kwan Kim, Hwaseong-si (KR); Doo-won Kwon, Seongnam-si (KR); Jeong-ki Kim, Seoul (KR); Wook-hwan Kim, Yongin-si (KR); Byung-jun Park, Yongin-si (KR); Seung-hun Shin, Suwon-si (KR); June-taeg Lee, Suwon-si (KR); Ha-kyu Choi, Yongin-si (KR); Tae-seok Oh, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/486,389

(22) Filed: Sep. 15, 2014

(65) Prior Publication Data

US 2015/0076649 A1    Mar. 19, 2015

(30) Foreign Application Priority Data

Sep. 16, 2013    (KR) .......................... 10-2013-0111187

(51) Int. Cl.
  *H01L 31/00*    (2006.01)
  *H01L 27/146*   (2006.01)
  *H01L 23/00*    (2006.01)

(52) U.S. Cl.
  CPC .......... *H01L 27/14643* (2013.01); *H01L 24/80* (2013.01); *H01L 27/1463* (2013.01);
  (Continued)

(58) Field of Classification Search
  CPC ........ H01L 23/482; H01L 21/02; H01L 31/00

USPC .................................... 257/446, 774; 438/455
See application file for complete search history.

(56) References Cited

U.S. PATENT DOCUMENTS 5,915,167 A      6/1999   Leedy
6,852,651 B2 *   2/2005   Shioya et al. ................. 438/790
(Continued)

FOREIGN PATENT DOCUMENTS

JP    2010-067844    3/2010
JP    2012-019147    1/2012
KR    1020110078558  7/2011

OTHER PUBLICATIONS

Yamasaki et al. "Direct observation of surface dangling bonds during plasma process: chemical reaction during $H_2$ and Ar plasma treatments" *Thin Solid Films*, 407, pp. 139-143, (2002).

(Continued)

*Primary Examiner* — Phuc Dang
(74) *Attorney, Agent, or Firm* — Myers Bigel Sibley & Sajovec, P.A.

(57) ABSTRACT

An electronic device may include a first semiconductor layer, a first electrode layer on the semiconductor layer, an adhesive insulating layer on the first electrode layer, a second electrode layer on the adhesive insulating layer, a second semiconductor layer. The first electrode layer may include a first plurality of electrodes, the first electrode layer may be between the adhesive insulating layer and the first semiconductor layer, and the adhesive insulating layer may include at least one of SiOCN, SiBN, and/or BN. The second electrode layer may include a second plurality of electrodes, the adhesive insulating layer may be between the first and second electrode layers, and the second electrode layer may be between the adhesive insulating layer and the second semiconductor layer.

20 Claims, 30 Drawing Sheets

(52) U.S. Cl.
CPC ........ *H01L27/1464* (2013.01); *H01L 27/1469* (2013.01); *H01L 27/14609* (2013.01); *H01L 27/14634* (2013.01); *H01L 27/14636* (2013.01); *H01L 27/14687* (2013.01); *H01L 27/14689* (2013.01); *H01L 27/14621* (2013.01); *H01L 27/14627* (2013.01); *H01L 2224/05547* (2013.01); *H01L 2224/08121* (2013.01); *H01L 2224/80895* (2013.01); *H01L 2224/80896* (2013.01)

(56) References Cited

U.S. PATENT DOCUMENTS

| | | |
|---|---|---|
| 6,867,073 B1 | 3/2005 | Enquist |
| 6,962,835 B2 | 11/2005 | Tong et al. |
| 7,157,787 B2 | 1/2007 | Kim et al. |
| 7,602,070 B2 | 10/2009 | Tong et al. |
| 7,714,403 B2 | 5/2010 | Lee et al. |
| 7,750,488 B2 | 7/2010 | Patti et al. |
| 7,842,540 B2 | 11/2010 | Tong et al. |
| 7,956,394 B2 | 6/2011 | Lee |
| 2010/0238331 A1 | 9/2010 | Umebayashi et al. |
| 2011/0041329 A1 | 2/2011 | Tong et al. |
| 2011/0128399 A1 | 6/2011 | Fujii |
| 2011/0157445 A1 | 6/2011 | Itonaga et al. |
| 2011/0233702 A1 | 9/2011 | Takahashi et al. |
| 2012/0105696 A1 | 5/2012 | Maeda |
| 2012/0199930 A1 | 8/2012 | Hayashi |
| 2013/0009321 A1* | 1/2013 | Kagawa et al. ............... 257/774 |
| 2013/0112849 A1 | 5/2013 | Shimotsusa |

OTHER PUBLICATIONS

Donato Pasquariello et al. "Surface energy as a function of self-bias voltage in oxygen plasma wafer bonding" *Sensors and Actuators,* 82, pp. 239-244, (2000).

J. Kowal et al. "Surface activation for low temperature wafer fusion bonding by radicals produced in an oxygen discharge" *Sensors and Actuators*, A 155, pp. 145-151, (2009).

* cited by examiner

ELECTRONIC DEVICES INCLUDING MULTIPLE SEMICONDUCTOR LAYERS

CROSS-REFERENCE TO RELATED APPLICATION

This application claims the benefit of priority from Korean Patent Application No. 10-2013-0111187, filed on Sep. 16, 2013, in the Korean Intellectual Property Office, the disclosure of which is incorporated herein in its entirety by reference.

BACKGROUND

Inventive concepts disclosed herein relate to image sensors and methods of manufacturing the same, and more particularly, to stack type image sensors and methods of manufacturing the same.

Since an image sensor is a device that converts an optical image into electrical signals that are applied to an apparatus such as a mobile phone, a digital camera, and/or a display device, the image sensor should be relatively small. In order to reduce a size of an image sensor and to increase a number of image sensors formed on a substrate, it may be useful to develop a stack type image sensor formed by adhering one substrate onto another substrate.

SUMMARY

Inventive concepts according to some embodiments may provide stack type image sensors formed by adhering two substrates.

Inventive concepts according to some embodiments may also provide methods of manufacturing stack type image sensors.

According to some embodiments of inventive concepts, a stack type image sensor is formed by stacking a first substrate on a second substrate. The first substrate includes a first semiconductor layer on which device elements of a pixel circuit are formed, a first electrode layer including first electrodes formed to be electrically connected to the pixel circuit, and a first adhesive insulating film that covers peripheries of the first electrodes. A first adhesive surface is formed by the first adhesive insulating film. The second substrate includes a second semiconductor layer on which device elements of a logic circuit for driving the pixel circuit are formed, a second electrode layer including second electrodes formed to be electrically connected to the logic circuit, and a second adhesive insulating film that covers peripheries of the second electrodes. A second adhesive surface is formed by the second adhesive insulating film that contacts the first adhesive insulating film.

The first adhesive insulating film and the second adhesive insulating film may be formed of the same material or different materials.

The first adhesive insulating film and the second adhesive insulating film may be formed of one selected from a group consisting of a silicon oxycarbon nitride (SiOCN) film, a silicon boron nitride (SiBN) film, a boron nitride (BN) film, a silicon carbon nitride (SiCN) film, and/or a silicon carbide (SiC) film. The first adhesive surface and the second adhesive surface may define relatively flat surfaces.

A first interlayer insulating film and a second interlayer insulating film may be formed under the first adhesive insulating film and the second adhesive insulating film, respectively. The first electrodes may be buried in first groove patterns formed in the first adhesive insulating film and the first interlayer insulating film, and the second electrodes may be buried in second groove patterns formed in the second adhesive insulating film and the second interlayer insulating film.

The first electrodes may be formed to contact the second electrodes.

Top parts of the first electrodes may be covered with the first adhesive insulating film, and top parts of the second electrodes may be covered with the second adhesive insulating film. The first electrode may be connected to the second electrode using a through electrode that passes through the first semiconductor layer, the first adhesive insulating film, and the second adhesive insulating film.

A first intermediate wiring layer may be further formed on the first semiconductor layer to provide electrical wiring lines of the pixel circuit. A second intermediate wiring layer may be further formed on the second semiconductor layer for electrical wiring lines of the logic circuit.

The first adhesive surface may consist of the first electrode and the first adhesive insulating film, the second adhesive surface may consist of the second electrode and the second adhesive insulating film, and the first electrode may be formed to contact the second electrode.

According to some other embodiments of inventive concepts, a stack type image sensor is formed by stacking a first substrate on a second substrate. The first substrate includes a first semiconductor layer on which device elements of a pixel circuit are formed, a first electrode layer including first electrodes formed to be electrically connected to the pixel circuit, and a first adhesive insulating film that covers peripheries of the first electrodes. A first adhesive surface is formed by the first electrodes and the first adhesive insulating film.

The second substrate includes a second semiconductor layer on which device elements of a logic circuit for driving the pixel circuit are formed, a second electrode layer including second electrodes formed to be electrically connected to the logic circuit and to contact the first electrodes, and a second adhesive insulating film that covers peripheries of the second electrodes. A second adhesive surface is formed by the second electrodes and the second adhesive insulating film that contacts the first adhesive insulating film.

The first electrode and the second electrode may be one of a plane electrode and a via electrode. The first adhesive insulating film and the second adhesive insulating film may be formed of one selected from a group consisting of a SiOCN film, a SiBN film, and a BN film. A width of the second electrode is equal to or larger than that of the first electrode.

According to still other embodiments of inventive concepts, a method of manufacturing a stack type image sensor may include providing a first substrate having a pixel circuit and a first adhesive insulating film, providing a second substrate having a logic circuit and a second adhesive insulating film, activating the first adhesive insulating film of the first substrate by plasma, activating the second adhesive insulating film of the second substrate by plasma, stacking the first substrate and the second substrate so that the activated second adhesive insulating film and first adhesive insulating film face each other to adhere the first substrate and the second substrate, and performing post thermal processing on the adhered first and second substrates.

The first substrate and the second substrate may further include first electrodes and second electrodes, respectively, and the first adhesive insulating film and the second adhesive insulating film may be formed to cover peripheries of the first electrodes and the second electrodes.

Plasma activation of the first adhesive insulating film and the second adhesive insulating film may be performed by hydrogen, argon, and/or nitrogen plasma.

A hydroxyl group may be further introduced to the activated first and second adhesive insulating films.

According to yet other embodiments of inventive concepts, an electronic device may include a first semiconductor layer, a first electrode layer on the semiconductor layer, an adhesive insulating layer on the first electrode layer, a second electrode layer on the adhesive insulating layer, and a second semiconductor layer. The first electrode layer may include a first plurality of electrodes, the first electrode layer may be between the adhesive insulating layer and the first semiconductor layer, and the adhesive insulating layer may include at least one of silicon oxycarbon nitride (SiOCN), silicon boron nitride (SiBN), and/or boron nitride (BN). The second electrode layer may include a second plurality of electrodes, the adhesive insulating layer may be between the first and second electrode layers and the second electrode layer may be between the adhesive insulating layer and the second semiconductor layer.

The electronic device may include an image sensor, the first semiconductor layer may include a plurality of pixel sensors therein, the electrodes of the first plurality of electrodes may be coupled with respective pixel sensors of the plurality of pixel sensors, and the electrodes of the second plurality of electrodes may be coupled with respective electrodes of the first plurality of electrodes. The second semiconductor layer may include a plurality of electronic circuits thereon, and electronic circuits of the plurality of electronic circuits may be coupled with respective pixel sensors of the plurality of pixel sensors through respective electrodes of the first and second pluralities of electrodes.

The adhesive insulating layer may include silicon oxycarbon nitride (SiOCN).

The adhesive insulating layer may include first and second adhesive insulating layers, and the first adhesive insulating layer may be between the first electrode layer and the second adhesive insulating layer.

The first adhesive insulating layer may include a silicon oxycarbon nitride (SiOCN) layer, a silicon boron nitride (SiBN) layer, and/or a boron nitride (BN) layer. The second adhesive insulating layer may include a silicon oxycarbon nitride (SiOCN) layer, a silicon boron nitride (SiBN) layer, a boron nitride (BN) layer, a silicon carbon nitride (SiCN) layer, and/or a silicon carbide (SiC) layer.

A first electrode of the first plurality of electrodes may extend through an opening in the first adhesive insulating layer, a second electrode of the second plurality of electrodes may extend through an opening in the second adhesive insulating layer, the opening in the first adhesive insulating layer may be larger than the opening in the second adhesive insulating layer, and the first and second openings may be aligned so that the first and second electrodes are electrically coupled. The second adhesive insulating layer may be between portions of the first electrode and the second semiconductor layer. The first and second electrodes may be electrically coupled at respective first and second interface surfaces thereof, a surface area of the first interface surface of the first electrode may be greater than a surface area of the second interface surface of the second electrode.

The electrodes of the second plurality of electrodes may be electrically coupled with the electrodes of the first plurality of electrodes through respective openings through the adhesive insulating layer.

The first electrode layer may include a first interlayer insulating layer between the adhesive insulating layer and the first semiconductor layer. Each of the electrodes of the first plurality of electrodes may be provided through a respective opening through the first interlayer insulating layer. The second electrode layer may include a second interlayer insulating layer between the adhesive insulating layer and the second semiconductor layer. Each of the electrodes of the second plurality of electrodes may be provided through a respective opening through the second interlayer insulating layer.

In addition, the electronic device may include a third interlayer insulating layer between the second semiconductor layer and the second electrode layer, and the third interlayer insulating layer may include a dielectric material having a dielectric constant less than 2.4.

The electronic device may also include an electrically conductive through silicon via extending through the first semiconductor layer, the first electrode layer, and the adhesive insulating layer. The electrically conductive through silicon via may provide electrical coupling between one of the first plurality of electrodes and one of the second plurality of electrodes.

According to more embodiments of inventive concepts, an electronic device may include a first semiconductor layer, a first electrode layer on the semiconductor layer, an adhesive insulating layer on the first electrode layer, a second electrode layer on the adhesive insulating layer, and a second semiconductor layer. The first electrode layer may include a first plurality of electrodes, the first electrode layer may be between the adhesive insulating layer and the first semiconductor layer, and the adhesive insulating layer may include a layer of silicon oxycarbon nitride (SiOCN). The second electrode layer may include a second plurality of electrodes, and the adhesive insulating layer may be between the first and second electrode layers. The second electrode layer may be between the adhesive insulating layer and the second semiconductor layer.

The electronic device may be an image sensor, and the first semiconductor layer may include a plurality of pixel sensors therein. The electrodes of the first plurality of electrodes may be coupled with respective pixel sensors of the plurality of pixel sensors, the electrodes of the second plurality of electrodes may be coupled with respective electrodes of the first plurality of electrodes, and the second semiconductor layer may include a plurality of electronic circuits thereon. Electronic circuits of the plurality of electronic circuits may be coupled with respective pixel sensors of the plurality of pixel sensors through respective electrodes of the first and second pluralities of electrodes.

The adhesive insulating layer may include first and second adhesive insulating layers, and the first adhesive insulating layer may be between the first electrode layer and the second adhesive insulating layer.

The first adhesive insulating layer may include a silicon oxycarbon nitride (SiOCN) layer, and the second adhesive insulating layer may include a silicon oxycarbon nitride (SiOCN) layer, a silicon boron nitride (SiBN) layer, a boron nitride (BN) layer, a silicon carbon nitride (SiCN) layer, and/or a silicon carbide (SiC) layer.

A first electrode of the first plurality of electrodes may extend through an opening in the first adhesive insulating layer, a second electrode of the second plurality of electrodes may extend through an opening in the second adhesive insulating layer, and the opening in the first adhesive insulating layer may be larger than the opening in the second adhesive insulating layer. The first and second openings may be aligned so that the first and second electrodes are electrically coupled. The second adhesive insulating may be between portions of the first electrode and the second semiconductor layer. The first and second electrodes may be electrically coupled at respective first and second interface surfaces thereof, and a surface area of the first interface surface of the first electrode may be greater than a surface area of the second interface surface of the second electrode.

The electrodes of the second plurality of electrodes may be electrically coupled with the electrodes of the first plurality of electrodes through respective openings through the adhesive insulating layer.

The first electrode layer may include a first interlayer insulating layer between the adhesive insulating layer and the first semiconductor layer. Each of the electrodes of the first plurality of electrodes may be provided through a respective opening through the first interlayer insulating layer. The second electrode layer may include a second interlayer insulating layer between the adhesive insulating layer and the second semiconductor layer, and each of the electrodes of the second plurality of electrodes may be provided through a respective opening through the second interlayer insulating layer.

In addition, the electronic device may include an interlayer insulating layer between the second semiconductor layer and the second electrode layer, and the interlayer layer insulating layer may include a dielectric material having a dielectric constant less than 2.4.

According to further embodiments of inventive concepts, an electronic device may include a first semiconductor layer, a first electrode layer on the first semiconductor layer, a first adhesive insulating layer on the first electrode layer, a second adhesive insulating layer on the first adhesive insulating layer, a second electrode layer on the second adhesive insulating layer, and a second semiconductor layer. The first electrode layer may include a first plurality of electrodes, the first electrode layer may be between the first adhesive insulating layer and the first semiconductor layer, and a first electrode of the first plurality of electrodes may extend through an opening in the first adhesive insulating layer. The first adhesive insulating layer may be between the second adhesive insulating layer and the first semiconductor layer. The second electrode layer may include a second plurality of electrodes, the second adhesive insulating layer may be between the first adhesive insulating layer and the second electrode layer, and a second electrode of the second plurality of electrodes may extend through an opening in the second adhesive insulating layer. The opening in the first adhesive insulating layer may be larger than the opening in the second adhesive insulating layer, and the openings in the first and second adhesive insulating layers may be aligned so that the first and second electrodes are electrically coupled. Moreover, the second electrode layer may be between the adhesive insulating layer and the second semiconductor layer.

The first and second electrodes may be electrically coupled at respective first and second interface surfaces thereof, and a surface area of the first interface surface of the first electrode may be greater than a surface area of the second interface surface of the second electrode.

The first adhesive insulating layer may include at least one of silicon oxycarbon nitride (SiOCN), silicon boron nitride (SiBN), boron nitride (BN); silicon carbon nitride (SiCN), and/or silicon carbide (SiC). The second adhesive insulating layer may include at least one of silicon oxycarbon nitride (SiOCN), silicon boron nitride (SiBN), boron nitride (BN), silicon carbon nitride (SiCN), and/or silicon carbide (SiC).

The first adhesive insulating layer may include at least one of silicon oxycarbon nitride (SiOCN), silicon boron nitride (SiBN), and/or boron nitride (BN). The second adhesive insulating layer may include at least one of silicon oxycarbon nitride (SiOCN), silicon boron nitride (SiBN), and/or boron nitride (BN). Moreover, the first and second adhesive insulating layers may include respective layers of a same material.

The first adhesive insulating layer may include a first layer of silicon oxycarbon nitride (SiOCN), and the second adhesive insulating layer may include a second layer of silicon oxycarbon nitride (SiOCN).

The electronic device may be an image sensor, and the first semiconductor layer may include a plurality of pixel sensors therein. The electrodes of the first plurality of electrodes may be coupled with respective pixel sensors of the plurality of pixel sensors, the electrodes of the second plurality of electrodes may be coupled with respective electrodes of the first plurality of electrodes, and the second semiconductor layer may include a plurality of electronic circuits thereon. Electronic circuits of the plurality of electronic circuits may be coupled with respective pixel sensors of the plurality of pixel sensors through respective electrodes of the first and second pluralities of electrodes.

The electrodes of the second plurality of electrodes may be electrically coupled with the electrodes of the first plurality of electrodes through respective openings through the adhesive insulating layers.

The first electrode layer may include a first interlayer insulating layer between the first adhesive insulating layer and the first semiconductor layer, and each of the electrodes of the first plurality of electrodes may be provided through a respective opening through the first interlayer insulating layer. The second electrode layer may include a second interlayer insulating layer between the second adhesive insulating layer and the second semiconductor layer, and each of the electrodes of the second plurality of electrodes may be provided through a respective opening through the second interlayer insulating layer.

In addition, the electronic device may include an inter-metal dielectric layer between the second semiconductor layer and the second electrode layer, and the inter-metal dielectric layer may include a dielectric material having a dielectric constant greater than 2.4.

According to more embodiments of inventive concepts, a method of forming an electronic device may include providing a first semiconductor wafer, forming a first interlayer insulating layer on the first semiconductor wafer, and forming a first adhesive insulating layer on the first interlayer insulating layer so that the first interlayer insulating layer is between the semiconductor wafer and the first adhesive insulating layer wherein the adhesive insulating layer and the first interlayer insulating layer comprise different materials. A buffer layer may be formed on the first adhesive insulating layer so that the first adhesive insulating layer is between the first interlayer insulating layer and the buffer layer wherein the buffer layer and the first adhesive insulating layer comprise different materials. The buffer layer, the adhesive insulating layer, and the interlayer insulating layer may be patterned to form openings therethrough, and an electrically conductive layer may be formed on the buffer layer and in the openings through the etch stop layer, the adhesive insulating layer, and the interlayer insulating layer. Portions of the electrically conductive layer may be removed to expose the buffer layer and to define a first plurality of electrodes in the openings through the interlayer insulating layer and the adhesive insulating layer. After removing portions of the electrically conductive layer, the buffer layer may be removed to expose the first adhesive insulating layer. A second semiconductor wafer, a second electrode layer on the second semiconductor wafer, and a second adhesive insulating layer on the second electrode layer may be provided, wherein the second electrode layer is between the second semiconductor wafer and the second adhesive insulating layer, and wherein the second electrode layer includes a second plurality of electrodes exposed through respective openings in the second adhesive insulating layer. The first and second wafers may be bonded at the first and second adhesive insulating layers so that the first and second adhesive insulating layers are between the first and second semiconductor wafers.

The first semiconductor wafer may include a plurality of pixel sensors therein, and electrodes of the first plurality of electrodes may be coupled with respective pixel sensors of the plurality of pixel sensors. The second semiconductor wafer may include a plurality of electronic circuits thereon, and electrodes of the second plurality of electrodes may be coupled with respective electronic circuits of the plurality of electronic circuits. After bonding, electronic circuits of the plurality of electronic circuits may be coupled with respective pixel sensors of the plurality of pixel sensors through respective electrodes of the first and second pluralities of electrodes.

Bonding may include performing a plasma activation of at least one of the first and/or second adhesive insulating layers, and adhering the first and second adhesive insulating layers after performing the plasma activation. Bonding may further include introducing a hydroxyl group to at least one of the first and/or second adhesive insulating layers before adhering the first and second adhesive insulating layers.

Bonding may include introducing a hydroxyl group to at least one of the first and/or second adhesive insulating layers, and adhering the first and second adhesive insulating layers after introducing the hydroxyl group.

The first adhesive insulating layer and/or the second adhesive insulating layer may include at least one of silicon oxycarbon nitride (SiOCN), silicon boron nitride (SiBN), boron nitride (BN), silicon carbon nitride (SiCN), and/or silicon carbide (SiC).

The first and second adhesive insulating layers may include respective layers of a same material.

The first adhesive insulating layer may include a silicon oxycarbon nitride (SiOCN) layer, a silicon boron nitride (SiBN) layer, and/or a boron nitride (BN) layer.

The second adhesive insulating layer may include a silicon oxycarbon nitride (SiOCN) layer, a silicon boron nitride (SiBN) layer, and/or a boron nitride (BN) layer.

According to other embodiments of inventive concepts, a method of forming an electronic device may include providing a first semiconductor wafer, forming a first interlayer insulating layer on the first semiconductor wafer, and forming a first adhesive insulating layer on the first interlayer insulating layer so that the first interlayer insulating layer is between the first semiconductor wafer and the first adhesive insulating layer wherein the first adhesive insulating layer and the first interlayer insulating layer comprise different materials, and wherein the first adhesive insulating layer comprises at least one of silicon oxycarbon nitride (SiOCN), silicon boron nitride (SiBN), and/or boron nitride (BN). A first plurality of electrodes may be formed through the first adhesive insulating layer and the first interlayer insulating layer. A second semiconductor wafer may be provided, a second interlayer insulating layer may be formed on the second semiconductor wafer, and a second adhesive insulating layer may be formed on the second interlayer insulating layer so that the second interlayer insulating layer is between the second semiconductor wafer and the second adhesive insulating layer wherein the second adhesive insulating layer and the second interlayer insulating layer comprise different materials, and wherein the second adhesive insulating layer comprises at least one of silicon oxycarbon nitride (SiOCN), silicon boron nitride (SiBN), and/or boron nitride (BN). A second plurality of electrodes may be formed through the second adhesive insulating layer and the second interlayer insulating layer, and the first and second wafers may be bonded at the first and second adhesive insulating layers so that the first and second adhesive insulating layers are between the first and second semiconductor wafers.

BRIEF DESCRIPTION OF THE DRAWINGS

Examples of embodiments of inventive concepts will be more clearly understood from the following detailed description taken in conjunction with the accompanying drawings in which.

DETAILED DESCRIPTION OF THE EMBODIMENTS

Figure 1:
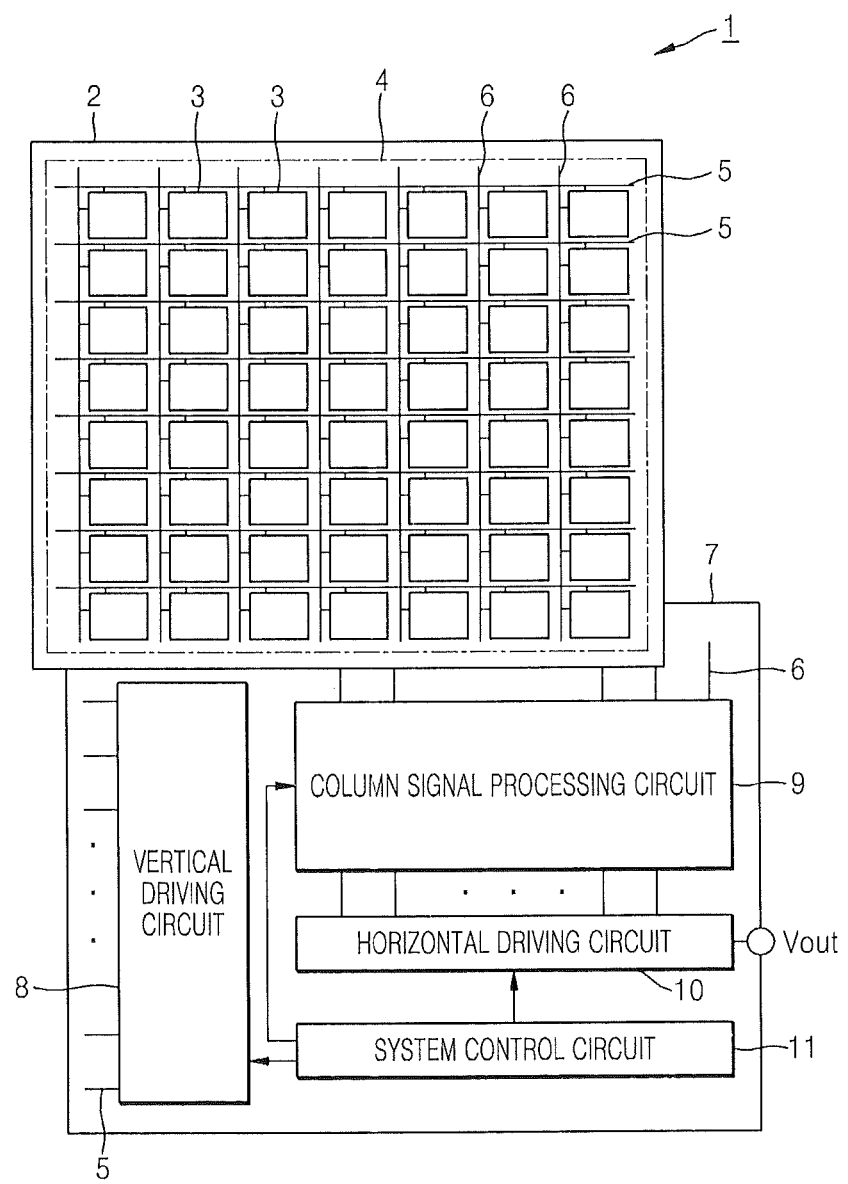
FIG. 1 is a circuit diagram schematically illustrating a stack type image sensor according to an example of inventive concepts.

Embodiments of inventive concepts will now be described more fully with reference to the accompanying drawings, in which examples of embodiments of inventive concepts are shown. The same elements in the drawings are denoted by the same reference numerals and a repeated explanation thereof may be omitted and/or abbreviated for the sake of conciseness.

Inventive concepts now will be described more fully hereinafter with reference to the accompanying drawings, in which elements of inventive concepts are shown. Inventive concepts may, however, be embodied in many different forms and should not be construed as limited to the examples of embodiments set forth herein. Rather, these embodiments are provided so that this disclosure will be thorough and complete, and will fully convey the scope of inventive concepts to one of ordinary skill in the art.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of inventive concepts. For example, a first element may be named a second element and similarly a second element may be named a first element without departing from the scope of inventive concepts.

Unless otherwise defined, all terms (including technical and scientific terms) used herein have the same meaning as commonly understood by one of ordinary skill in the art to which inventive concepts belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In the examples of embodiments, a specific order of processes may be changed. For example, two processes consecutively described herein may be simultaneously performed or may be performed in an order opposite to that described.

Variations from the shapes of the illustrations as a result, for example, of manufacturing techniques and/or tolerances, are to be expected. Thus, examples of embodiments should not be construed as limited to the particular shapes of regions illustrated herein but may be construed to include deviations in shapes that result, for example, from manufacturing tolerances.

Stack Type Image Sensor Circuit

FIG. 1 is a circuit diagram schematically illustrating stack type image sensors according to an example of inventive concepts.

Specifically, a stack type image sensor 1 may include a first substrate 2 and a second substrate 7. The stack type image sensor 1 may be formed by stacking the first substrate 2 on the second substrate 7 and adhering the first substrate 2 and the second substrate 7. The first substrate 2 may be a sensor substrate including a pixel circuit. The second substrate 7, on which a logic circuit for driving the pixel circuit is formed, may be a support substrate supporting the first substrate 2.

More particularly, a pixel region 4, in which a plurality of pixels 3 including photoelectric conversion region may be regularly and two-dimensionally arranged, is provided on one surface of the first substrate 2. In the pixel region 4, a plurality of pixel driving lines 5 are arranged in a row direction, a plurality of vertical signal lines 6 are arranged in a column direction, and one pixel 3 is arranged to be connected to one pixel driving line 5 and one vertical signal line 6. In each pixel 3, a pixel circuit formed of a photoelectric conversion region (also referred to as a photoelectric converter region), a charge accumulating region (also referred to as a charge accumulator), a plurality of transistors such as metal oxide semiconductor (MOS) transistors, and a capacity device may be provided.

A logic circuit (e.g., including a vertical driving circuit 8 to drive the pixels 3 provided on the first substrate 2, a column signal processing circuit 9, a horizontal driving circuit 10, and a system control circuit 11) may be provided on one surface of the second substrate.

Stack Type Image Sensor Structure according to First and Second Embodiments

Figure 2A:
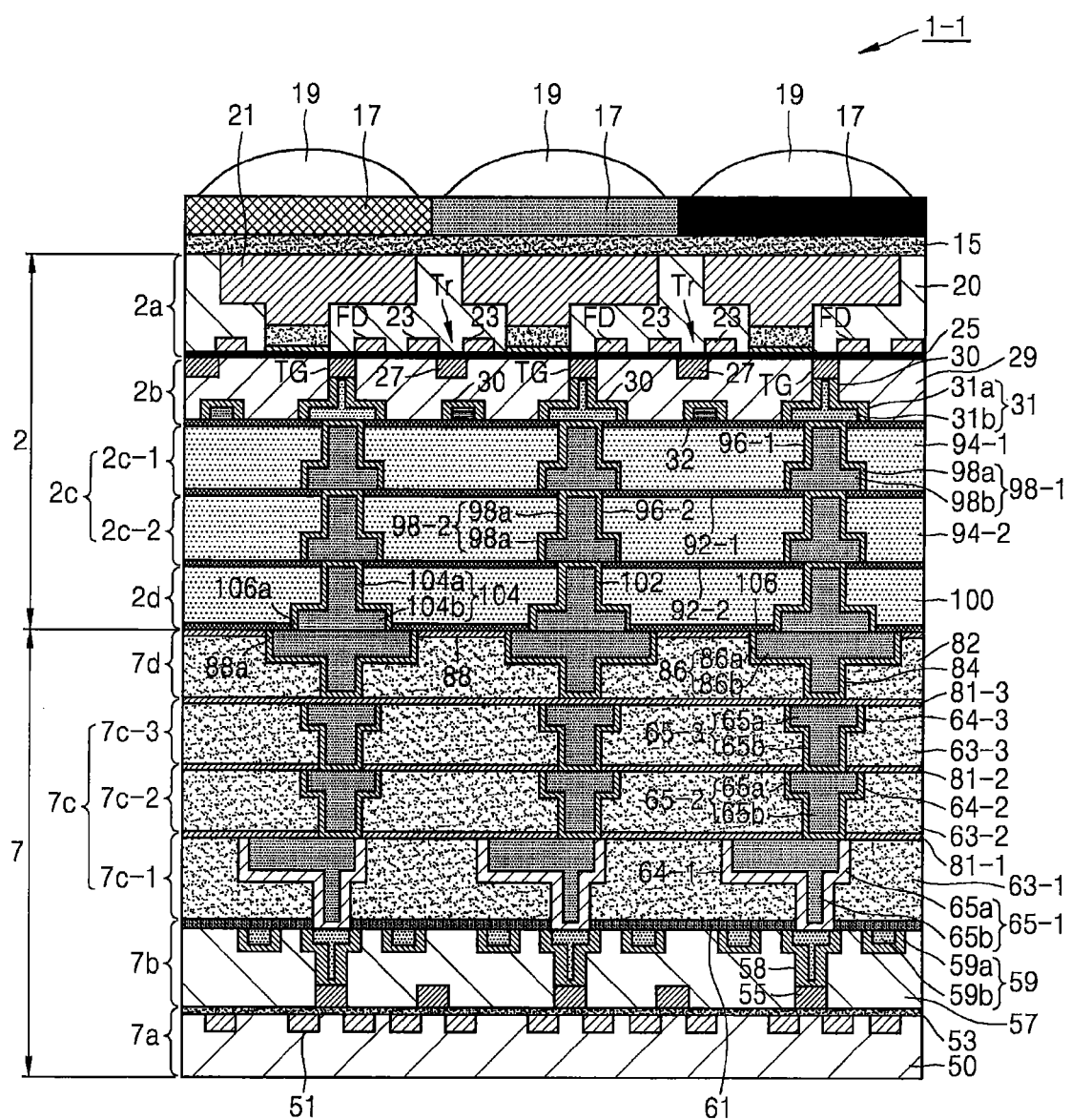
FIG. 2A is a cross-sectional view illustrating elements of a stack type image sensor according to first embodiments of inventive concepts.

FIG. 2A is a cross-sectional view illustrating elements of a stack type image sensor according to first embodiments of inventive concepts.

More particularly, a stack type image sensor 1-1 of FIG. 2A is an example of a configuration in which the first substrate 2 and the second substrate 7 are adhered. The first substrate 2 is formed of a first semiconductor layer 2a on which device elements that form a pixel circuit are formed, a first gate wiring layer 2b arranged on the first semiconductor layer 2a toward the second substrate 7, a first intermediate wiring layer 2c arranged on the first gate wiring layer 2b toward the second substrate 7, and a first electrode layer 2d.

The second substrate 7 is formed of a second semiconductor layer 7a on which device elements of a logic circuit to drive the pixel circuit are formed, a second gate wiring layer 7b arranged on the second semiconductor layer 7a toward the first substrate 2, a second intermediate wiring layer 7c arranged on the second gate wiring layer 7b toward the first substrate 2, and a second electrode layer 7d formed in the uppermost part.

In the first substrate 2, on a surface opposite to the second substrate 7, a protective film 15, a color filter layer 17, and lenses 19 are sequentially stacked. The protective film 15 may be formed of a material film having a passivation characteristic, for example, a silicon oxide film, a silicon nitride film, or a silicon oxynitride film.

The color filter layer 17 may be formed of color filters of respective colors corresponding to respective photoelectric conversion regions 21. The lenses 19 are provided to correspond to the respective photoelectric conversion regions 21 and the color filters of the respective colors that form the color filter layer 17 and are formed so that incident light is focused on the respective photoelectric conversion regions 21. The stack type image sensor 1-1 of FIG. 2A is a rear surface illumination structure in which incident light is incident on a rear surface of the first substrate 2.

In the first substrate 2 and the second substrate 7, a surface of the first electrode layer 2d is adhered to a surface of the second electrode layer 7d. An adhesion structure between the first electrode layer 2d and the second electrode layer 7d will be described in detail later. Detailed structures of layers that form the first substrate 2 and the second substrate 7 will be sequentially described.

First, the structure of the first substrate 2 will be described. The first semiconductor layer 2a is obtained by thinning a semiconductor substrate (20 of FIG. 3A) such as a single crystal silicon substrate. In the first semiconductor layer 2a, the photoelectric conversion region 21 formed of n-type impurity layer (or a p-type impurity layer) is provided in each pixel. Floating diffusions FD formed of n+-type impurity layers and source/drain regions 23 of transistors Tr are provided. A photoelectric conversion regions 21, floating diffusion FD, and a transistors Tr (including respective source/drain regions 23) form a pixel circuit. A gate insulating film 25 is formed on a surface of the first semiconductor layer 2a.

In the first gate wiring layer 2b, transmission gates TG, and gate electrodes 27 of the transistors Tr are formed on the gate insulating film 25 at an interface between the first semiconductor layer 2a and the first gate wiring layer 2b. The transmission gates TG and the gate electrodes 27 are covered with a first interlayer insulating film 29. In the first interlayer insulating film 29, first groove patterns 30 that expose the transmission gates TG and/or the gate electrodes 27 are formed. In the first groove patterns 30 provided in the first interlayer insulating film 29, first buried wiring lines 31 are provided.

The first interlayer insulating film 29 may be formed of a silicon oxide film. The first buried wiring lines 31 may be formed of first barrier metal films 31a and first metal films 31b. The first metal films 31b may be formed of copper and/or aluminium. The first barrier metal films 31a may be formed of tantalum (Ta) and/or tantalum nitride (TaN).

The first barrier metal films 31 a may be provided to present/reduce metal diffusion into the first interlayer insulating film 29 and/or to improve contact properties between the first interlayer insulating film 29 and the first metal films 31b in the first groove patterns 30. A first diffusion barrier film 32 is formed on the first interlayer insulating film 29 and the first buried wiring lines 31. The first diffusion barrier film 32 may prevent/reduce a metal that forms the first buried wiring lines 31 from being diffused into a second interlayer insulating film 94-1, The first intermediate wiring layer 2c is electrically connected to the first gate wiring layer 2b and may be formed of a multilayer wiring layer of a first auxiliary wiring layer 2c-1 and a second auxiliary wiring layer 2c-2. According to present embodiment, the two auxiliary wiring layers 2c-1 and 2c-2 are formed. However, as occasion demands, the number of auxiliary wiring layers may be one or no less than three, The first intermediate wiring layer 2c may include second interlayer insulating films 94-1 and 94-2, second diffusion barrier films 92-1 and 92-2, and second buried wiring lines 98-1 and 98-2. The second buried wiring lines 98-1 and 98-2 may be buried in second groove patterns 96-1 and 96-2 formed in the second interlayer insulating films 94-1 and 94-3. The second buried wiring lines 98-1 and 98-2 may be formed using a dual damascene process as mixed wiring lines including via wiring lines and plane wiring lines, which will be described in greater detail below, The second interlayer insulating films 94-1 and 94-2 may be formed of the same material as that of the first interlayer insulating film 29. The second buried wiring lines 98-1 and 98-2 may be formed of a second barrier metal film 98a and a second metal film 98b. The second buried wiring lines 98-1 and 98-2 may be formed of the same material as that of the first buried wiring lines 31. The second diffusion barrier films 92-1 and 92-2 may be formed of the same material as that of the first diffusion barrier film 32.

The first electrode layer 2d may include a third interlayer insulating film 100, first electrodes 104, and first adhesive insulating film 106. The third interlayer insulating film 100 is formed toward the second substrate 7 to cover the second diffusion barrier film 92-2. The third interlayer insulating film 100 may be formed of the same material as used for the first and second interlayer insulating films 29, 94-1, and 94-2.

The first electrodes 104 may be formed to be buried in third groove patterns 102 formed in the third interlayer insulating film 100. The first electrodes 104 may be formed using a dual damascene process as mixed electrodes of via electrodes and plane electrodes. The first electrodes 104 may be formed of third barrier metal films 104a and third metal films 104b. The first electrodes 104 may be formed of the same material used for of the first buried wiring lines 31 and the second buried wiring lines 98-1 and 98-2.

The first adhesive insulating film 106 is formed on the third interlayer insulating film 100 toward the second substrate 7 to cover peripheries of the first electrodes 104. The first adhesive insulating film 106 may be formed on the third interlayer insulating film 100 toward the second substrate 7 to contact the first electrodes 104. The first adhesive insulating film 106 may form an adhesive surface that contacts the second substrate 7. The first adhesive insulating film 106 may prevent/reduce diffusion of a metal material that forms the first electrodes 104. The first adhesive insulating film 106 may be formed of the same material(s) used for the first diffusion barrier film 32 and/or the second diffusion barrier films 92-1 and 92-2.

As described above, the first electrode layer 2d includes the first electrodes 104 and the first adhesive insulating film 106 that covers the peripheries of the first electrodes 104. The first electrodes 104 and the first adhesive insulating film 106 form a first adhesive surface 109 for the second substrate 7 on the first substrate 1 The first adhesive surface 109 may provide a relatively flat surface. The flat surface may desirably provide roughness and/or flatness on the order of 0 Å. In one embodiment, the flat surface may have roughness of no more than 5 Å and flatness of no more than 70 Å.

Since the first adhesive insulating film 106 forms the adhesive surface, the first adhesive insulating film 106 may be formed of a material having high adhesive strength and reliability for a second adhesive insulating film 88 of the second substrate 7 and may have low adhesive defect and substrate warpage. In addition, the first adhesive insulating film 106 may prevent/reduce diffusion of a material that forms the first electrodes 104.

To satisfy the above characteristics, the first adhesive insulating film 106 may be formed of an inorganic insulating material with lower molecular density than that of silicon oxide. The first adhesive insulating film 106 may be one selected from a silicon oxycarbon nitride (SiOCN) film, a silicon boron nitride (SiBN) film, a boron nitride (BN) film, a silicon carbon nitride (SiCN) film, and/or a silicon carbide (SiC) film.

In one embodiment, the first adhesive insulating film 106 may be formed of a SiOCN film, to reduce resistance capacitance (RC) delay because SiOCN has a lower dielectric constant (for example, no more than 4) than that (for example, 5.3) of SiCN in addition to the above-described adhesive characteristic.

In one embodiment, when the first adhesive insulating film 106 is formed of SiBN and/or BN, since SiBN and BN include boron (B), it may be possible to increase adhesive strength for the second adhesive insulating film 88 of the second substrate 7.

Next, the second substrate 7 will be described in greater detail.

The second semiconductor layer 7a of the second substrate 7 may be obtained by thinning a semiconductor substrate 50 such as single crystal silicon substrate. In the second semiconductor layer 7a, source/drain regions 51 of transistors Tr are formed toward the first substrate 2. A gate insulating film 53 is formed on a surface of the second semiconductor layer 7a.

In the second gate wiring layer 7b, gate electrodes 55 are formed on the gate insulating film 53 at an interface between the second semiconductor layer 7a and the second gate wiring layer 7b. The gate electrodes 55 are covered with a first interlayer insulating film 57, and first buried wiring lines 59 are provided in first groove patterns 58 provided in the first interlayer insulating film 57.

Structures of the first interlayer insulating film 57 and the first buried wiring lines 59 may be the same as those of the first gate wiring layer 2b of the first substrate 2. That is, in the first interlayer insulating film 57, the first groove patterns 58 that expose the gate electrodes 55 are formed. In the first groove patterns 58 provided in the first interlayer insulating film 57, first buried wiring lines 59 are provided.

The first interlayer insulating film 57 may be formed of a silicon oxide film. The first buried wiring lines 59 may be formed of first barrier metal films 59a and first metal films 59b. The first metal films 59b may be formed of copper and/or aluminium. The first barrier metal films 59a may be formed of Ta and/or TaN.

The first barrier metal films 59a may prevent/reduce metal diffusion into the first interlayer insulating film 57 and/or may improve contact properties between the first interlayer insulating film 57 and the first metal films 59b in the first groove patterns 58. A first diffusion barrier film 61 is formed on the first interlayer insulating film 57 and the first buried wiring lines 59. The first diffusion barrier film 61 may prevent/reduce diffusion of a metal that forms the first buried wiring lines 59 into a second interlayer insulating film 63-1.

The second intermediate wiring layer 7c is electrically connected to the second gate wiring layer 7b and may be formed of a multilayer wiring layer of a first auxiliary wiring layer 7c-1, a second auxiliary wiring layer 7c-2, and a third auxiliary wiring layer 7c-3. According to present embodiments, the three auxiliary wiring layers 7c-1, 7c-2, and 7c-3 are formed. However, as occasion demands, the number of auxiliary wiring layers may be one, two, or no less than four. The second intermediate wiring layer 7c may include second interlayer insulating films 63-1, 63-2, and 63-3, second diffusion barrier films 81-1, 81-2, and 81-3, and second buried wiring lines 65-1, 65-2, and 65-3.

The second interlayer insulating films 63-1, 63-2, and 63-3 may be formed of the same material as that of the first interlayer insulating film 57. The second buried wiring lines 65-1, 65-2, and 65-3 may be buried in second groove patterns 64-1, 64-2, and 64-3 formed in the second interlayer insulating films 63-1, 63-2, and 63-3. The second buried wiring lines 65-1, 65-2, and 65-3 may be formed of second barrier metal films 65a and second metal films 65b. The second buried wiring lines 65-1, 65-2, and 65-3 may be formed of the same material as that of the first buried wiring lines 59. The second diffusion barrier films 81-1, 81-2, and 81-3 may be formed of the same material as that of the first diffusion barrier film 61.

The second electrode layer 7d may include a third interlayer insulating film 82, second electrodes 86, and second adhesive insulating film 88. The third interlayer insulating film 82 is formed to cover the second diffusion barrier film 81-3 toward the first substrate 2. The third interlayer insulating film 82 may be formed of the same material as the first and second interlayer insulating films 59, 63-1, 63-2, and 63-3.

The second electrodes 86 may be formed to be buried in third groove patterns 84. The second electrodes 86 may be formed of barrier metal films 86a and metal films 86b. The second electrodes 86 may be formed of the same material as those of the first buried wiring lines 59 and the second buried wiring lines 65-1, 65-2, and 65-3.

The second adhesive insulating film 88 is formed on the third interlayer insulating film 82 toward the first substrate 2 to cover peripheries of the second electrodes 86. The second adhesive insulating film 88 may be formed on the third interlayer insulating film 82 toward the first substrate 2 to contact the second electrodes 86. The second adhesive insulating film 88 may form a second adhesive surface that contacts the first substrate 2. The second adhesive insulating film 88 may prevent/reduce diffusion of a metal material that forms the second electrodes 86. The second adhesive insulating film 88 may be formed of the same material as the first diffusion barrier film 61 and the second diffusion barrier films 81-1, 81-2, and 81-3.

As described above, the second electrode layer 7d includes the second electrodes 86 and the second adhesive insulating film 88 that covers the peripheries of the second electrodes 86. The second electrodes 86 and the second adhesive insulating film 88 are adhered to the first electrodes 104 and the first adhesive insulating film 106, respectively, so that a second adhesive surface for the first substrate 2 is formed on the second substrate 7. The second adhesive surface may provide a relatively flat surface. The flat surface may desirably provide roughness and/or flatness are on the order of 0 Å. In one embodiment, the flat surface may have roughness of no more than 5 Å and flatness of no more than 70 Å. A width (or length) of the second electrodes 86 may be equal to or larger than that of the first electrodes 104.

Since the second adhesive insulating film 88 forms the second adhesive surface, the second adhesive insulating film 88 may be formed of a material having high adhesive strength and reliability for first adhesive insulating film 106 formed on the first substrate 2 and having low adhesive defect and substrate warpage. In addition, the second adhesive insulating film 88 may prevent/reduce diffusion of a material that forms the second electrodes 86.

To satisfy the above characteristics, the second adhesive insulating film 88 may be formed of the same material as that of the first adhesive insulating film 106 as described above. The second adhesive insulating film 88 of the second substrate 7 may be formed of a material that is the same as or different from that of the first adhesive insulating film 106 of the first substrate 2 so long as the second adhesive insulating film 88 of the second substrate 7 provides sufficient adhesive strength and reliability with respect to the first adhesive insulating film 106 of the first substrate 2. For example, when the first adhesive insulating film 106 is a SiOCN film, the second adhesive insulating film 88 may be one of a SiBN film and a BN film.

As described above, in the stack type image sensor 1-1, the adhesive surface of the first substrate 2 and the adhesive surface of the second substrate 7 may be formed of the adhesive insulating films 88 and 106 and the electrodes 86 and 104 so that it is possible to secure adhesive strength and to prevent/reduce diffusion of a metal material that forms the electrodes 86 and 104 from the interlayer insulating films 100 and 82. In addition, RC delay may be reduced.

Figure 2B:
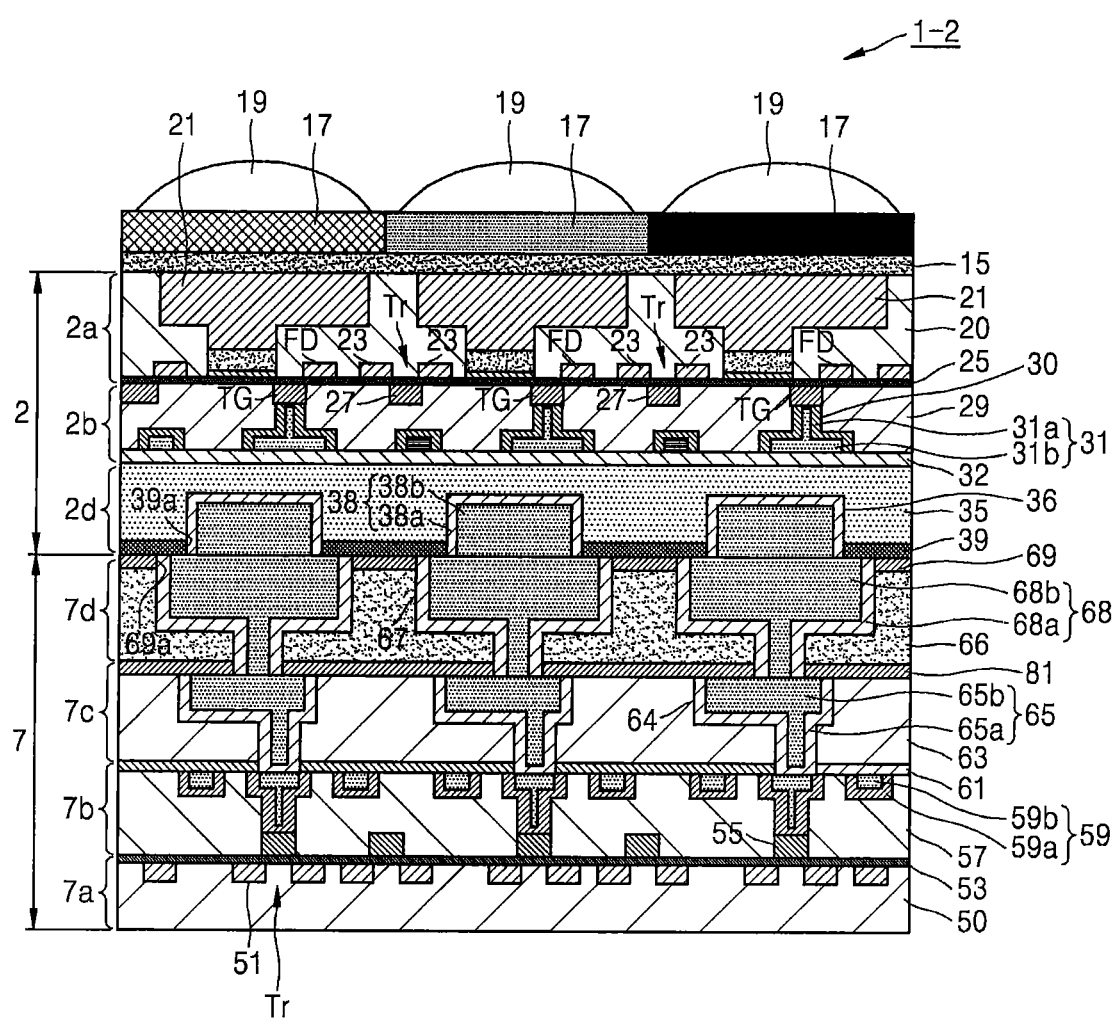
FIG. 2B is a cross-sectional view illustrating elements of a stack type image sensor according to second embodiments of inventive concepts.

FIG. 2B is a cross-sectional view illustrating elements of a stack type image sensor according to second embodiments of inventive concepts.

Specifically, the stack type image sensor 1-2 of FIG. 2B is similar to the stack type image sensor 1-1 of FIG. 2A excluding the structures of the first electrode layer 2d of the first substrate 2 and the second electrode layer 7d of the second substrate 7.

The first semiconductor layer 2a and the first gate wiring layer 2b of the first substrate 2 are the same as the stack type image sensor 1-1 of FIG. 2A. In comparison with FIG. 2A, in FIG. 2B, the intermediate wiring layer is not formed on the first gate wiring layer 2b of the first substrate 2 toward the second substrate 7.

The first electrode layer 2d is formed on the first gate wiring layer 2b. In the first electrode layer 2d, groove patterns 36 are formed in a second interlayer insulating film 35. First electrodes 38 are formed in the groove patterns 36. The first electrodes 38 may be plane electrodes formed using a single damascene process. The first electrodes 38 may be formed of the same material as that of the first electrodes 104 of FIG. 2A. Although not shown, the first electrodes 38 of the first electrode layer 2d and the first gate wiring layer 2b may be electrically connected using an additional wiring layer.

A first adhesive insulating film 39 is formed on the second interlayer insulating film 35 toward the second substrate 7 to cover peripheries of the first electrodes 38. The first adhesive insulating film 39 may be formed on the second interlayer insulating film 35 toward the second substrate 7 to contact the first electrodes 38. The first adhesive insulating film 39 may be formed of the same material as that of the first adhesive insulating film 106 of FIG. 2A and performs the same function as that of the first adhesive insulating film 106 of FIG. 2A.

The second semiconductor layer 7a, the second gate wiring layer 7b, and the second intermediate wiring layer 7c of the second substrate 7 are the same as those of the stack type image sensor 1-1 of FIG. 2A. In comparison with FIG. 2A, in FIG. 2B, the second intermediate wiring layer 7c is formed of one wiring layer. In FIG. 2B, reference numerals 64 and 81 denote groove patterns and diffusion barrier films, respectively.

The second electrode layer 7d is formed on the second intermediate wiring layer 7c. In the second electrode layer 7d, groove patterns 67 are formed in a third interlayer insulating film 66. Second electrodes 68 are formed in the groove patterns 67. The second electrodes 68 may be formed using a dual damascene process as mixed electrodes of via electrodes and plane electrodes. The second electrodes 68 may be formed of the same material as that of the second electrodes 86 of FIG. 2A.

A second adhesive insulating film 69 is formed on the third interlayer insulating film 66 toward the first substrate 2 to cover peripheries of the second electrodes 68. The second adhesive insulating film 69 may be formed on the third interlayer insulating film 66 toward the first substrate 2 to contact the second electrodes 68. The second adhesive insulating film 69 may be formed of the same material as that of the second adhesive insulating film 88 of FIG. 2A and may perform the same function as that of the second adhesive insulating film 88 of FIG. 2A.

Although structures of the first electrode layer 2d of the first substrate 2 and the second electrode layer 7d of the second substrate 7 of the stack type image sensor of FIG. 2B are different from those of the first electrode layer 2d of the first substrate 2 and the second electrode layer 7d of the second substrate 7 of the stack type image sensor of FIG, 2A, the adhesive surface of the first substrate 2 and the adhesive surface of the second substrate 7 may be formed of the adhesive insulating films 69 and 39 and the electrodes 68 and 38 so that it is possible to provide sufficient adhesive strength and to prevent/reduce diffusion of the metal material that forms the electrodes into the interlayer insulating films. In addition, in the stack type image sensor 1-2, RC delay may be reduced.

Operations of Manufacturing Stack Type Image Sensor according to First Embodiments FIGS, 3A to 3H are cross-sectional views illustrating operations of manufacturing the first substrate of FIG. 2A.

Figure 3A:
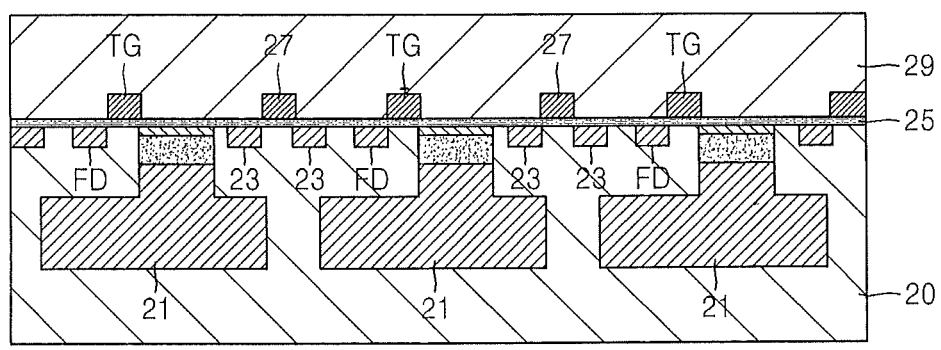
FIGS. 3A to 3H are cross-sectional views illustrating operations of manufacturing the first substrate of FIG. 2A.

Referring to FIG. 3A, the semiconductor substrate 20 formed of single crystal silicon is provided. The photoelectric conversion regions 21 are formed of n-type impurity layers to a predetermined depth from the semiconductor substrate 20, and charge transmission regions are formed of n+-type impurity layers or charge accumulation regions for holes are formed of p+-type impurity layers on surface layers of the photoelectric conversion regions 21. The floating diffusions FD formed of the n+-type impurity layers and the source/drain regions 23 are formed on a surface layer of the semiconductor substrate 20.

The gate insulating film 25 is formed on the surface of the semiconductor substrate 20, and the transmission gates TG and the gate electrodes 27 are formed on the gate insulating film 25. The transmission gates TG are formed between the floating diffusions FD and the photoelectric conversion regions 21, and the gate electrodes 27 are formed between the source/drain regions 23. Then, on the semiconductor substrate 20, the first interlayer insulating film 29 is formed of silicon oxide to cover the transmission gates TG and the gate electrodes 27.

Figure 3B:
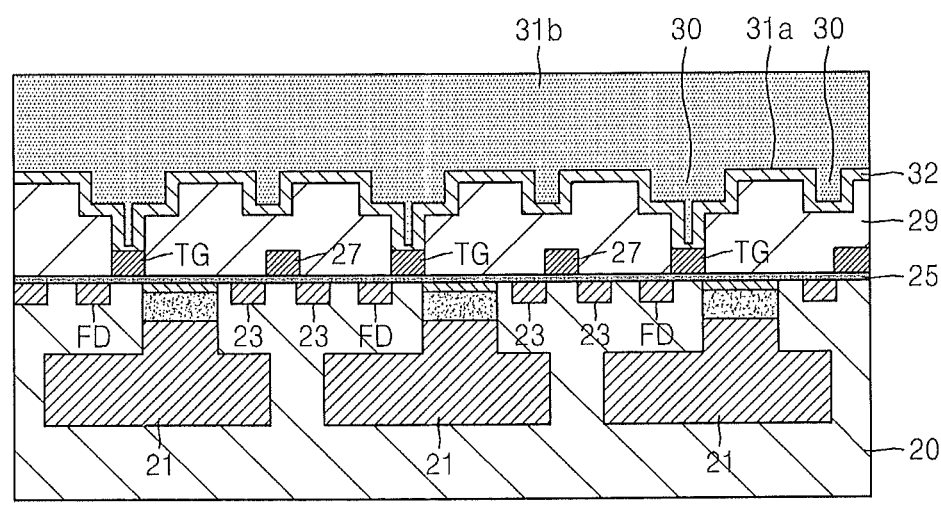

Referring to FIG. 3B, the first groove patterns 30 are formed in the first interlayer insulating film 29. The first groove patterns 30 may be formed to expose the transmission gates TG. Although not shown, the first groove patterns 30 that expose the source/drain regions 23 may be formed in the first interlayer insulating film 29 and the gate insulating film 25. The first barrier metal films 31a are formed to cover internal walls of the first groove patterns 30 and the first metal films 31b are formed on the first barrier metal films 31 a to bury the first groove patterns 30.

Figure 3C:
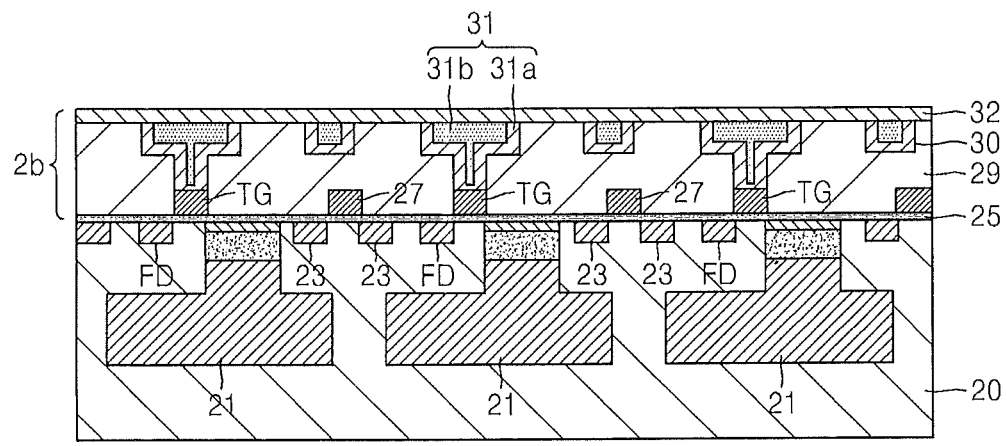

Referring to FIG. 3C, using a chemical mechanical polishing (CMP) operation, the first metal films 31b are planarized to be removed until the first barrier metal films 31a are exposed and the first barrier metal films 31a are planarized to be removed until the first interlayer insulating film 29 is exposed. As a result, the first buried wiring lines 31 are formed by burying the first metal films 31b in the first groove patterns 30 through the first barrier metal films 31a. The first diffusion barrier film 32 is formed on the first buried wiring lines 31 to obtain the first gate wiring layer 2b.

Figure 3D:
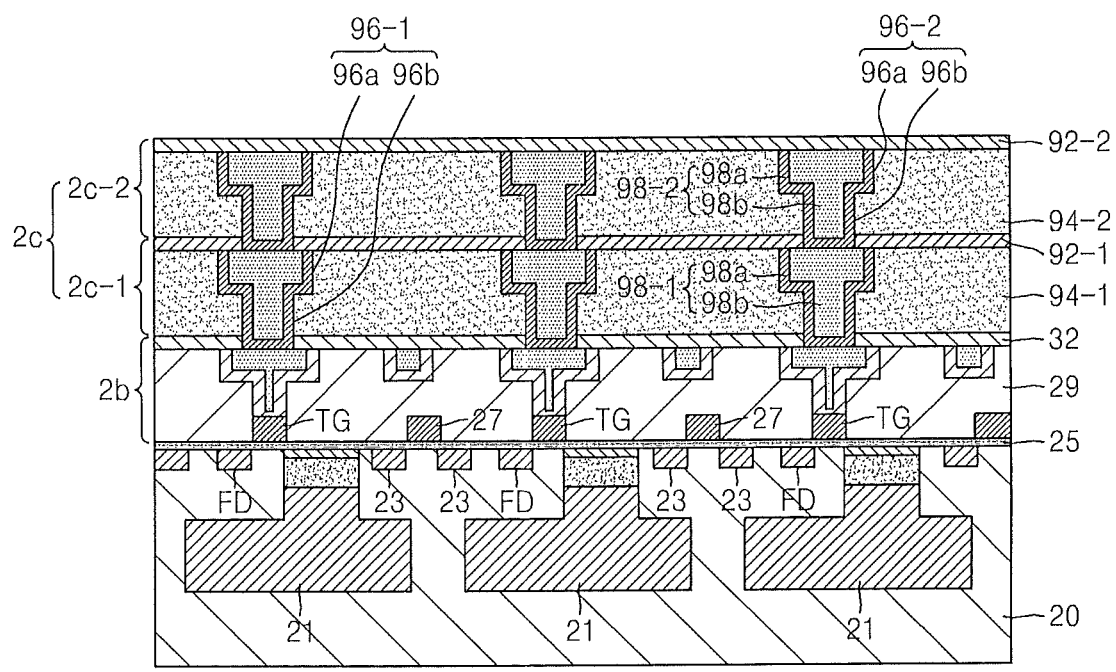

Referring to FIG. 3D, the first intermediate wiring layer 2c is formed on the first gate wiring layer 2b. The second interlayer insulating film 94-1 is formed on the first diffusion barrier film 32. The second groove patterns 96-1 are formed in the second interlayer insulating film 94-1. The second groove patterns 96-1 are completed by forming wide groove patterns 96a in a surface of the second interlayer insulating film 94-1 to a predetermined depth and then, forming narrow groove patterns 96b in the wide groove patterns 96a to expose the first buried wiring lines 31.

The second buried wiring lines 98-1 are formed of the second barrier metal films 98a and the second metal films 98b in the second groove patterns 96-1 using above-described operations. Using the dual damascene process, the second buried wiring lines 98-1 are formed as mixed wiring lines of the via wiring lines formed in the narrow groove patterns 96b and the plane wiring lines formed in the wide groove patterns 96a. The second diffusion barrier film 92-1 is formed on the second buried wiring lines 98-1 and the second interlayer insulating film 94-1 so that the first auxiliary wiring layer 2c-1 is formed in the first intermediate wiring layer 2c.

Continuously, the second auxiliary wiring layer 2c-2 is formed in the first intermediate wiring layer 2c using above-described operations. In the second auxiliary wiring layer 2c-2, the second buried wiring lines 98-2 are formed of the second barrier metal films 98a and the second metal films 98b in the second groove patterns 96-2 using the dual damascene process. The second buried wiring lines 98-2 are formed as mixed wiring lines of the via wiring lines formed in the narrow groove patterns 96b and the plane wiring lines formed in the wide groove patterns 96a. The second diffusion barrier film 92-2 is formed on the second buried wiring lines 98-2 and the second interlayer insulating film 94-2 so that the first auxiliary wiring layer 2c-1 is formed in the first intermediate wiring layer 2c.

Figure 3E:
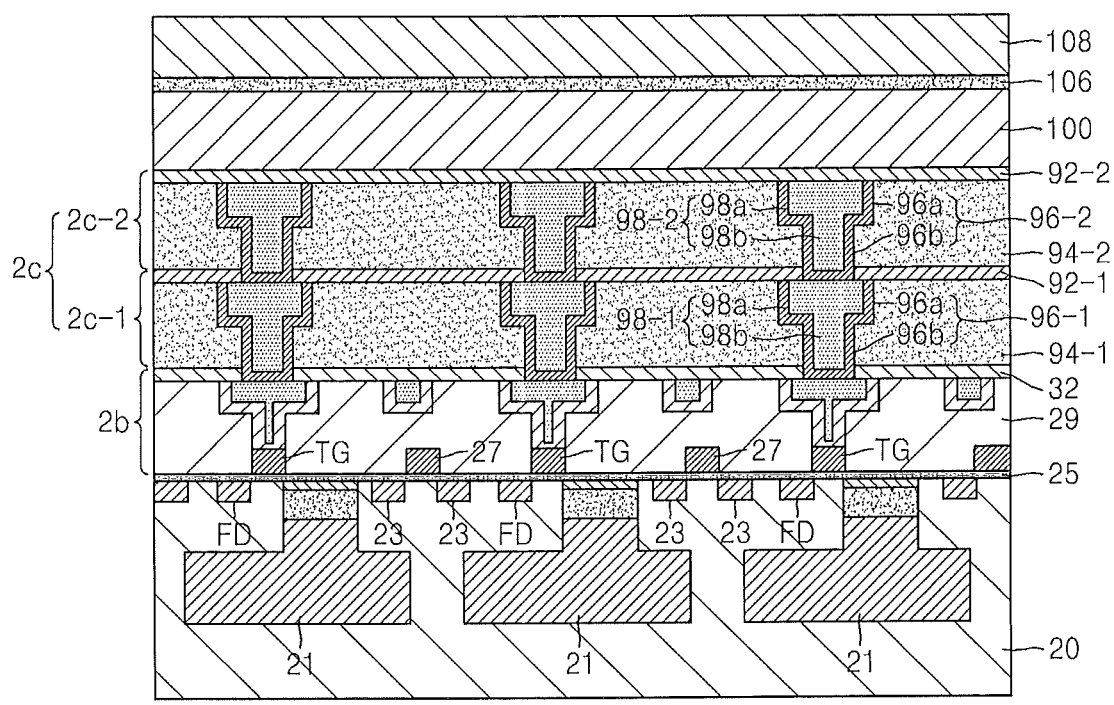
Figure 3F:
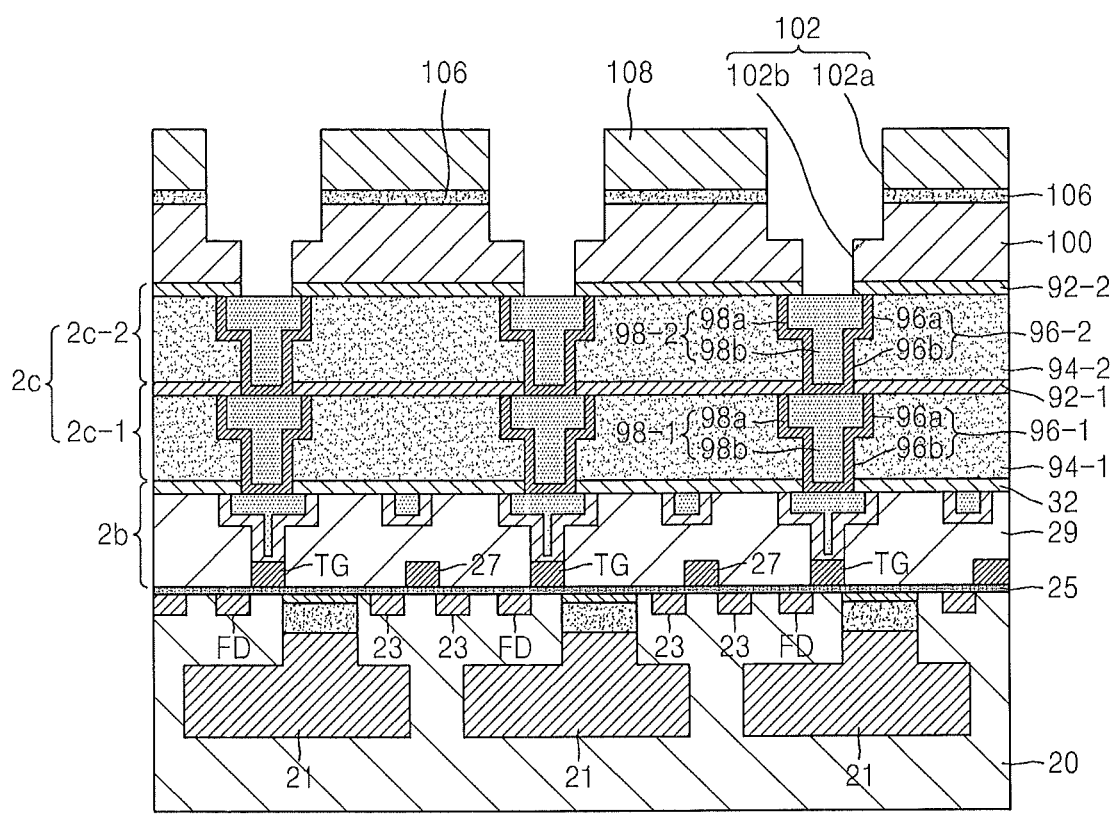

Referring to FIGS. 3E and 3F, as illustrated in FIG. 3E, the third interlayer insulating film 100, the first adhesive insulating film 106, and a buffer film 108 are sequentially formed on the second diffusion barrier film 92-2.

Then, as illustrated in FIG. 3F, the buffer film 108, the first adhesive insulating film 106, the third interlayer insulating film 100, and the second diffusion barrier film 92-2 are patterned so that the third groove patterns 102 that expose the second buried wiring lines 98-2 are formed. The third groove patterns 102 are formed of wide groove patterns 102a and narrow groove patterns 102b.

Figure 3G:
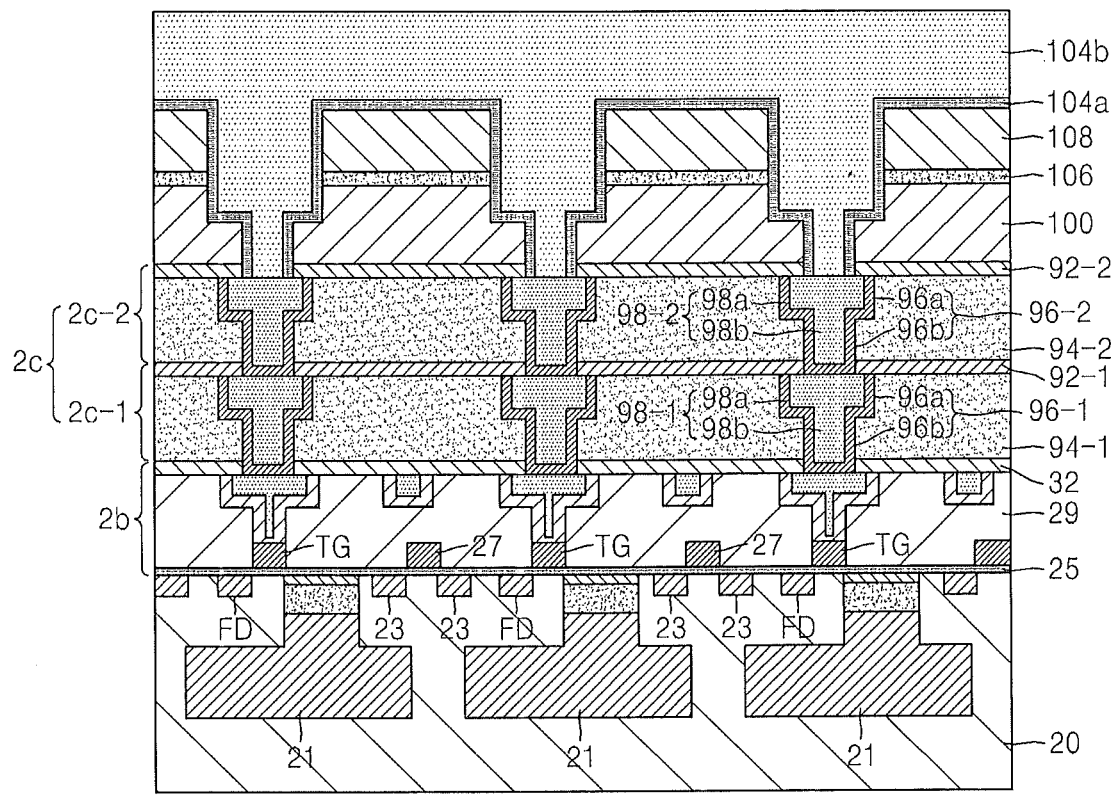
Figure 3H:
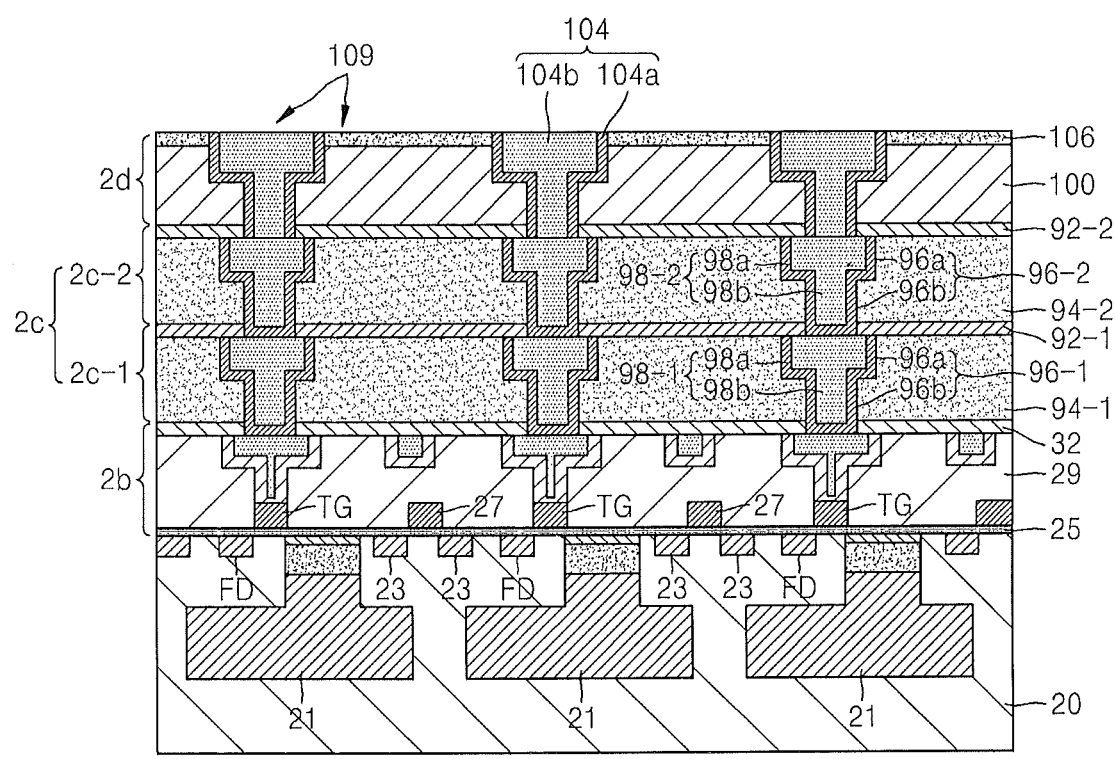

Referring to FIGS. 3G and 3H, as illustrated in FIG. 3G, the third barrier metal films 104a are formed in the third groove patterns 102 and the third metal films 104b are formed on the third barrier metal films 104a to bury the third groove patterns 102.

Continuously, as illustrated in FIG. 3H, the third metal films 104b, the third barrier metal films 104a, and the buffer film 108 are etched using the first adhesive insulating film 106 as an etch stop point to perform planarization (e.g., using chemical, mechanical polishing). The buffer film 108 prevents/reduces excessive etching of the first adhesive insulating film 106.

By doing so, the first electrodes 104 are formed in the third groove patterns 102 of the third interlayer insulating film 100. The first electrodes 104 are formed of the third barrier metal films 104a and the third metal films 104b. The first electrodes 104 are formed using the dual damascene process as the mixed electrodes of the via electrodes formed in the narrow groove patterns 102b and the plane electrodes formed in the wide groove patterns 102a. By doing so, the first electrode layer 2d is formed. The first electrode layer 2d includes the first electrodes 104 and the first adhesive insulating film 106 that covers the peripheries of the first electrodes 104.

As described above, the first adhesive insulating film 106 is formed on the third interlayer insulating film 100 to cover the peripheries of the first electrodes 104. The first adhesive insulating film 106 forms the first adhesive surface 109 that contacts the second substrate 7 and prevents/reduces diffusion of the metal material that forms the first electrodes 104. In addition, the first electrodes 104 form the first adhesive surface 109 that contacts the second substrate 7. The first adhesive surface 109 may provide a relatively flat surface. The flat surface desirably provides roughness and/or flatness on the order of 0 Å. In one embodiment, the flat surface may have roughness of no more than 5 Å and flatness of no more than 70 Å.

Figure 4A:
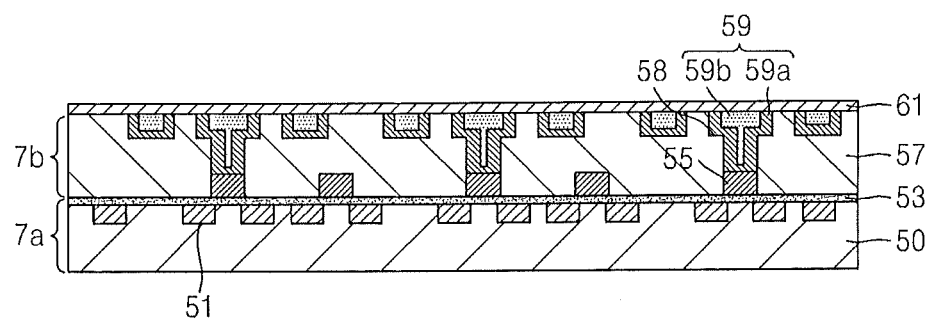
FIGS. 4A to 4C are cross-sectional views illustrating operations of manufacturing the second substrate of FIG. 2A.
Figure 4B:
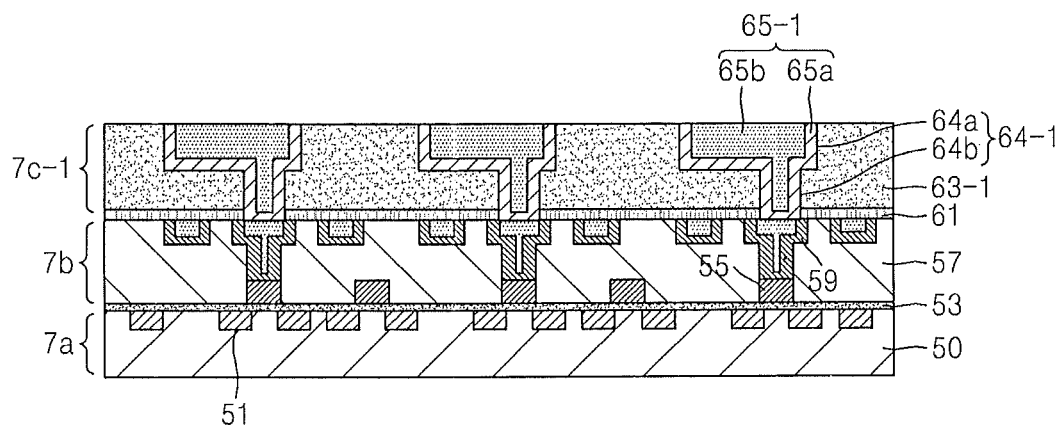
Figure 4C:
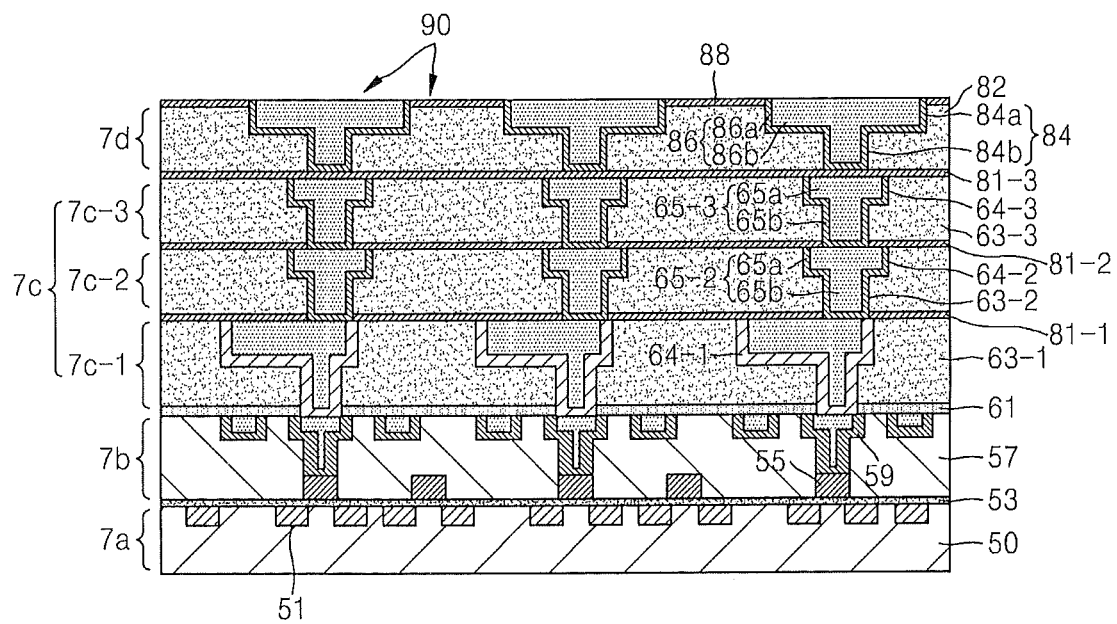

FIGS. 4A to 4C are cross-sectional views illustrating operations of manufacturing the second substrate of FIG. 2A.

Referring to FIG. 4A, the semiconductor substrate 50 formed of single crystal silicon is provided. The respective conductive types of source/drain regions 51 and other impurity layers that are not shown are formed on a surface layer of the semiconductor substrate 50. The gate insulating film 53 is formed on the surface of the semiconductor substrate 50 so that the second semiconductor layer 7a of the second substrate 7 is formed.

The gate electrodes 55 are formed on the gate insulating film 53. The gate electrodes 55 are formed between the source/drain regions 51. In addition, other electrodes that are not shown are formed by the same process. Then, on the semiconductor substrate 50, the first interlayer insulating film 57 is formed of silicon oxide to cover the gate electrodes 55.

Next, the first groove patterns 58 are formed in the first interlayer insulating film 57. The first groove patterns 58 may be formed to expose the gate electrodes 55. In addition, although not shown, the first groove patterns 58 that expose the source/drain regions 51 may be formed in the first interlayer insulating film 57 and the gate insulating film 53 as occasion commands.

Next, the first barrier metal films 59a are formed to cover internal walls of the first groove patterns 58 and the first metal films 59b are formed on the first barrier metal films 59a to bury the first groove patterns 58 so that the first buried wiring lines 59 are formed. The first diffusion barrier film 61 is formed on the first buried wiring lines 59 and the first interlayer insulating film 57 so that the second gate wiring layer 7b is formed.

Referring to FIG. 4B, the first auxiliary wiring layer 7c-1 that forms the second intermediate wiring layer 7c is formed on the second gate wiring layer 7b. The second interlayer insulating film 63-1 is formed on the first buried wiring lines 59 and the first interlayer insulating film 57. The second groove patterns 64-1 formed of the wide groove patterns 64a and the narrow groove patterns 64b are formed in the second interlayer insulating film 63-1. The second buried wiring lines 65-1 are formed of the second barrier metal films 65a and the second metal films 65b in the second groove patterns 64-1 of the second interlayer insulating film 63-1 using the dual damascene process.

Referring to FIG. 4C, the second auxiliary wiring layer 7c-2 and the third auxiliary wiring layer 7c-3 are formed on the first auxiliary wiring layer 7c-1 by the above-described operations so that the second intermediate wiring layer 7c is formed. In the second auxiliary wiring layer 7c-2, the second buried wiring lines 65-2 are formed of the second barrier metal films 65a and the second metal films 65b in the second groove patterns 64-2 of the second interlayer insulating film 63-2 using the dual damascene process. In the third auxiliary wiring layer 7c-3, the second buried wiring lines 65-3 are formed of the second barrier metal films 65a and the second metal films 65b in the second groove patterns 64-3 of the second interlayer insulating film 63-3 using the dual damascene process.

Continuously, the second electrode layer 7d is formed on the second intermediate wiring layer 7c. The second electrode layer 7d may be formed using the dual damascene process as described in FIGS. 3E to 3H. The second electrode layer 7d includes the second electrodes 86 buried in the third groove patterns 84 of the third interlayer insulating film 82. The second electrode layer 7d includes the second electrodes 86 and the second adhesive insulating film 88 that cover peripheries of the second electrodes 86.

The second electrodes 86 may be formed of the third barrier metal films 86a and the third metal films 86b. The second electrodes 86 include mixed electrodes of via electrodes formed in the narrow grooved patterns 84b and plane electrodes formed in the wide groove patterns 84a using the dual damascene process.

As described above, the second adhesive insulating film 88 forms the second adhesive surface 90 that contacts the first substrate 2 and prevents/reduces diffusion of the metal material that forms the second electrodes 86. In addition, the second electrodes 86 form the second adhesive surface 90 that contacts the first substrate 2. The second adhesive surface 90 may provide a relatively flat surface. The flat surface desirably provides roughness and/or flatness on the order of 0 Å. In one embodiment, the flat surface may have roughness of no more than 5 Å and flatness of no more than 70 Å.

Figure 5:
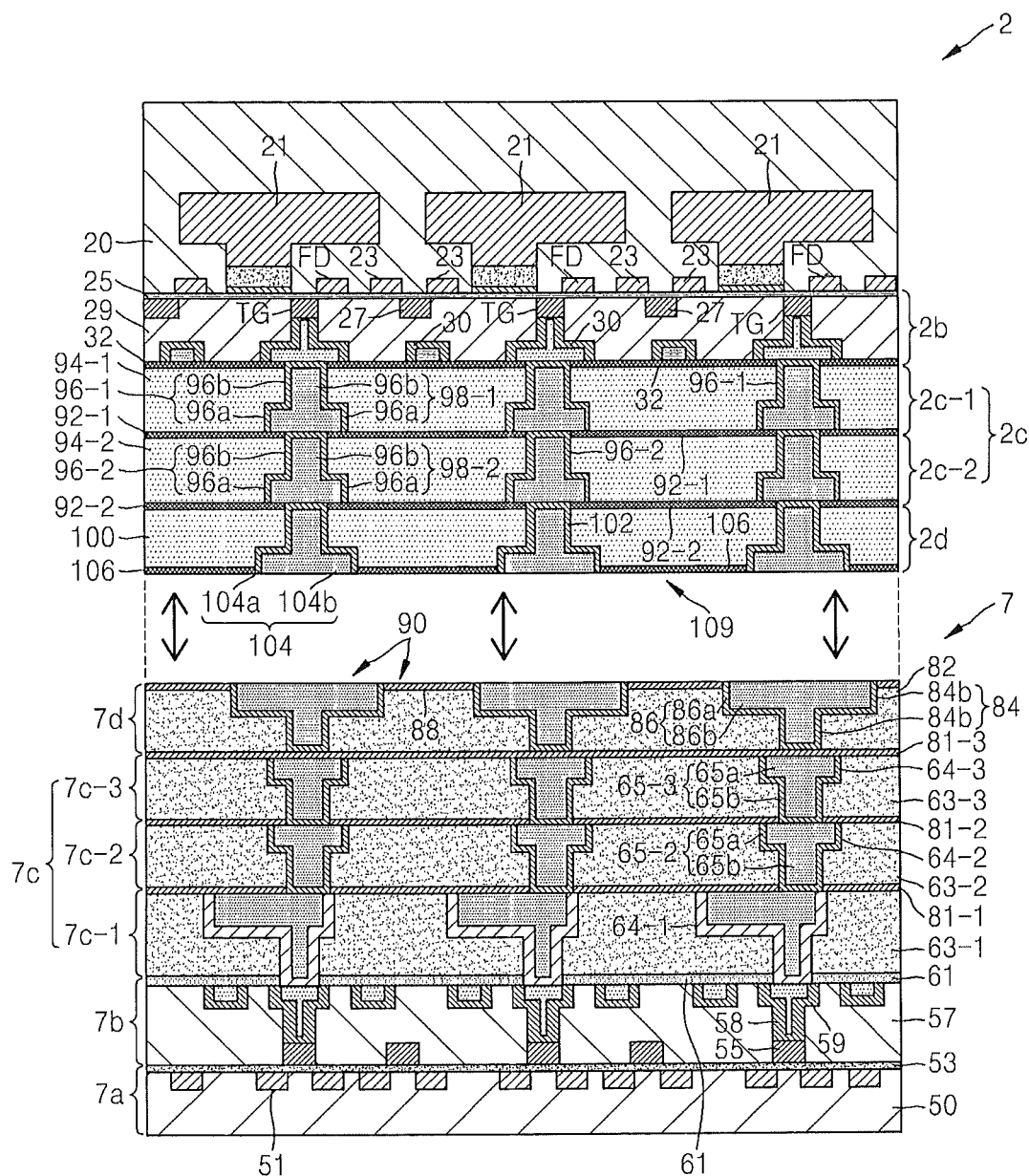
FIG. 5 is a cross-sectional view illustrating adhesion operations of FIGS. 3H and 4C.

FIG. 5 is a cross-sectional view illustrating the adhesion processes of FIGS. 3H and 4C.

More particularly, a structure may be obtained by reversing the structure of FIG. 3H so that the first electrode layer 2d is positioned in the lowermost part is placed on the second electrode layer 7d of FIG. 4C. Accordingly, in the first electrode layer 2d, the first electrodes 104 and the first adhesive insulating film 106 that covers the peripheries of the first electrodes 104 form the first adhesive surface 109 for the second substrate 7 on the first substrate 2. The first adhesive surface 109 may be the flat surface.

In the second electrode layer 7d, the second electrodes 86 and the second adhesive insulating film 88 that covers peripheries of the second electrodes 86 form the second adhesive surface 90 for the first substrate 2 on the second substrate 7. The second adhesive surface 90 may be the flat surface. The first adhesive surface 109 and the second adhesive surface 90 are made to face each other so that the first substrate 2 and the second substrate 7 are adhered. Adhesion between the first substrate 2 and the second substrate 7 will be described in greater detail below.

Since the first adhesive insulating film 106 and the second adhesive insulating film 88 form the adhesive surfaces 109 and 90, the first adhesive insulating film 106 and the second adhesive insulating film 88 may be formed of a material having high adhesive strength and reliability and low adhesive defect and substrate warpage. In addition, the first adhesive insulating film 106 and the second adhesive insulating film 88 may prevent/reduce diffusion of the material that forms the first electrodes 104 and the second electrodes 86. In addition, the adhesive insulating films 106 and 88 may provide reduced RC delay. The first adhesive insulating film 106 and the second adhesive insulating film 88 may be formed of the material that provides the above-described characteristics.

After adhering the first substrate 2 and the second substrate 7, the rear surface of the first substrate may be etched to be thinned. Then, the protective film 15, the color filter layer 17, and the lenses 19 may be formed on the rear surface of the first substrate 2 as illustrated in FIG. 2A.

Figure 6A:
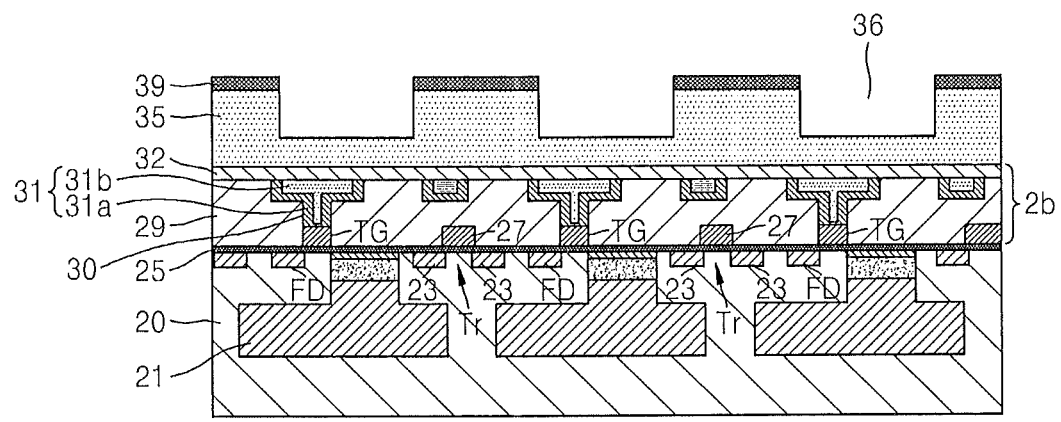
FIGS. 6A to 6C are cross-sectional views illustrating operations of manufacturing the first substrate of FIG. 2B.
Figure 6B:
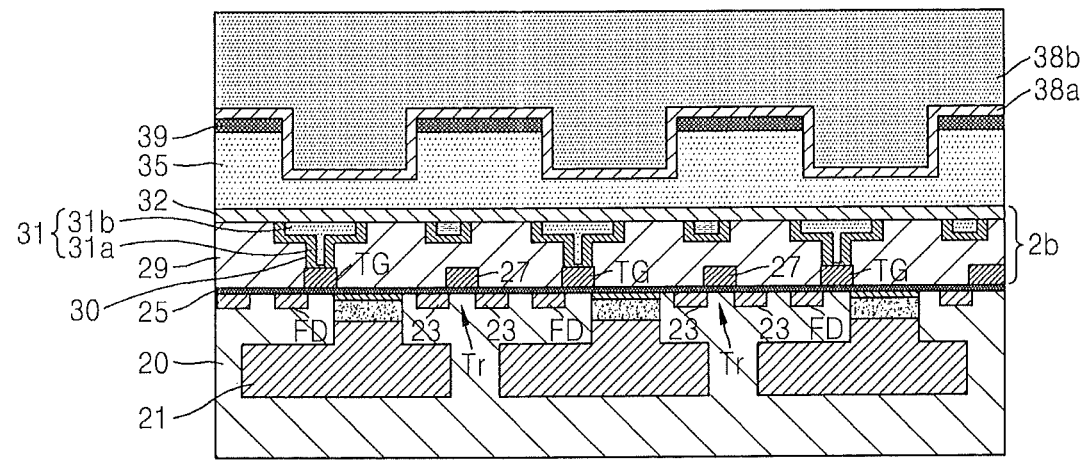
Figure 6C:
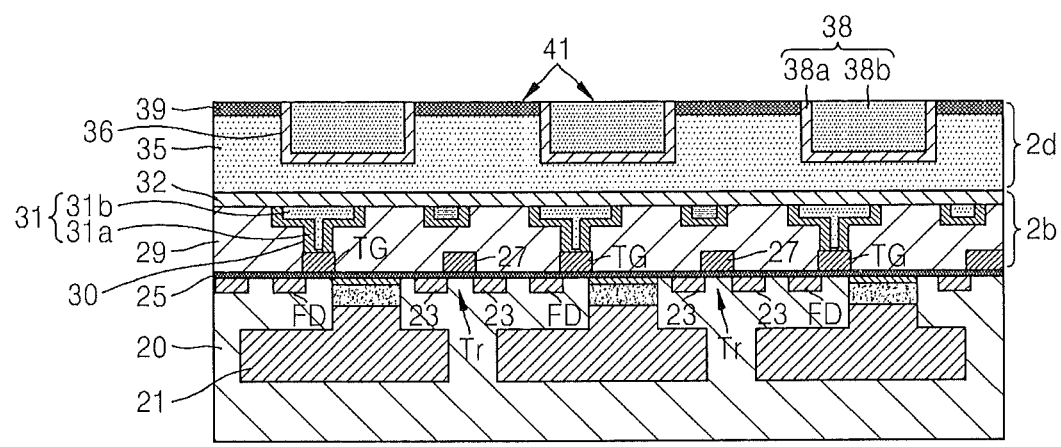

Operations of Manufacturing Stack Type Image Sensors according to Second Embodiments FIGS. 6A to 6C are cross-sectional views illustrating operations of manufacturing the first substrate of FIG. 2B.

Referring to FIG. 6A, the photoelectric conversion regions 21, the floating diffusions FD, and the source/drain regions 23 are formed on the semiconductor substrate 20 as illustrated in FIGS. 3A and 3B. Continuously, the gate insulating film 25, the transmission gates TG, and the gate electrodes 27 are formed on the surface of the semiconductor substrate 20. The first interlayer insulating film 29 is formed on the semiconductor substrate 20 to cover the transmission gates TG and the gate electrodes 27.

By the operations illustrated in FIG. 3C, the first buried wiring lines 31 are formed by burying the first barrier metal films 31a and the metal films 31b in the first groove patterns 30 of the first interlayer insulating film 29. The first diffusion barrier film 32 is formed on the first buried wiring lines 31 to obtain the first gate wiring layer 2b.

Referring to FIG. 6A again, the second interlayer insulating film 35 and the first adhesive insulating film 39 are formed on the first diffusion barrier film 32 of the first gate wiring layer 2b. Continuously, the first adhesive insulating film 39 and the second interlayer insulating film 35 are patterned so that the second groove patterns 36 are formed in the second interlayer insulating film 35. The second groove patterns 36 are formed to a predetermined depth from the surface of the second interlayer insulating film 35.

Referring to FIGS. 6B and 6C, as illustrated in FIG. 6B, the second barrier metal films 38a are formed in the second groove patterns 36 and on the first adhesive insulating film 39 and the second metal films 38b are formed on the second barrier metal films 38a to bury the second groove patterns 36.

Continuously, as illustrated in FIG. 6C, the second metal films 38b and the second barrier metal films 38a are etched using the first adhesive insulating film 39 as an etch stop point. By doing so, the first electrodes 38 are formed in the second groove patterns 36 of the second interlayer insulating film 35. The first electrodes 38 are formed of the second barrier metal films 38a and the second metal films 38b. The first electrode layer 2d is formed using the above described operations.

The first electrodes 38 are formed as plane electrodes buried in the wide groove patterns 36 using the above-described single damascene process. The first electrode layer 2d includes the first electrodes 38 and the first adhesive insulating film 39 that covers the peripheries of the first electrodes 38. The first adhesive insulating film 39 forms a first adhesive surface 41 that contacts the second substrate 7 and prevents/reduces diffusion of the metal material that forms the first electrodes 38. The first adhesive surface 41 may provide a relatively flat surface. The flat surface may desirably provide roughness and/or flatness on the order of 0 Å. In one embodiment, the flat surface may have roughness of no more than 5 Å and flatness of no more than 70 Å.

Figure 7A:
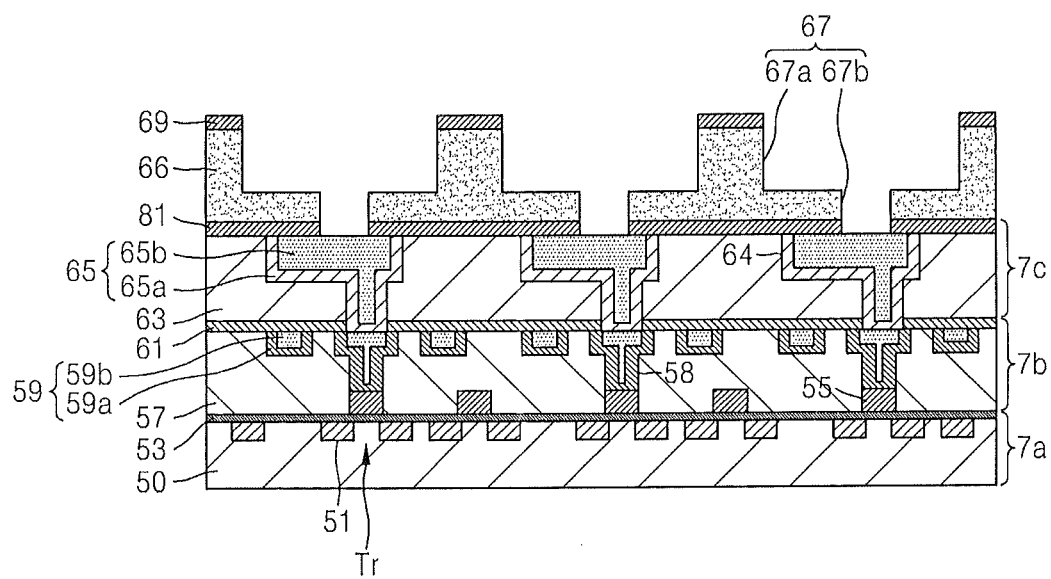
FIGS. 7A to 7C are cross-sectional views illustrating operations of manufacturing the second substrate of FIG. 2B.
Figure 7B:
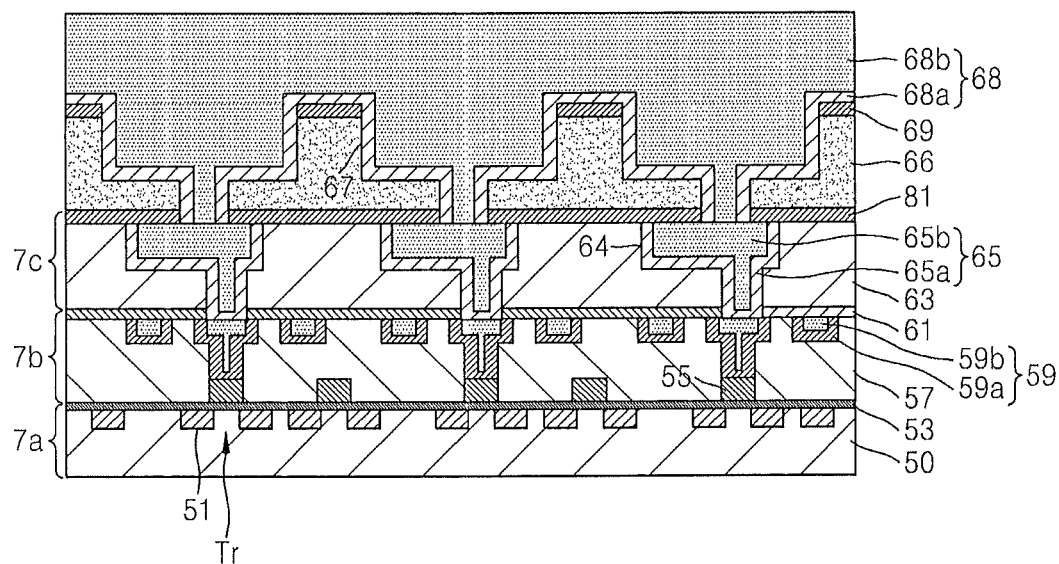
Figure 7C:
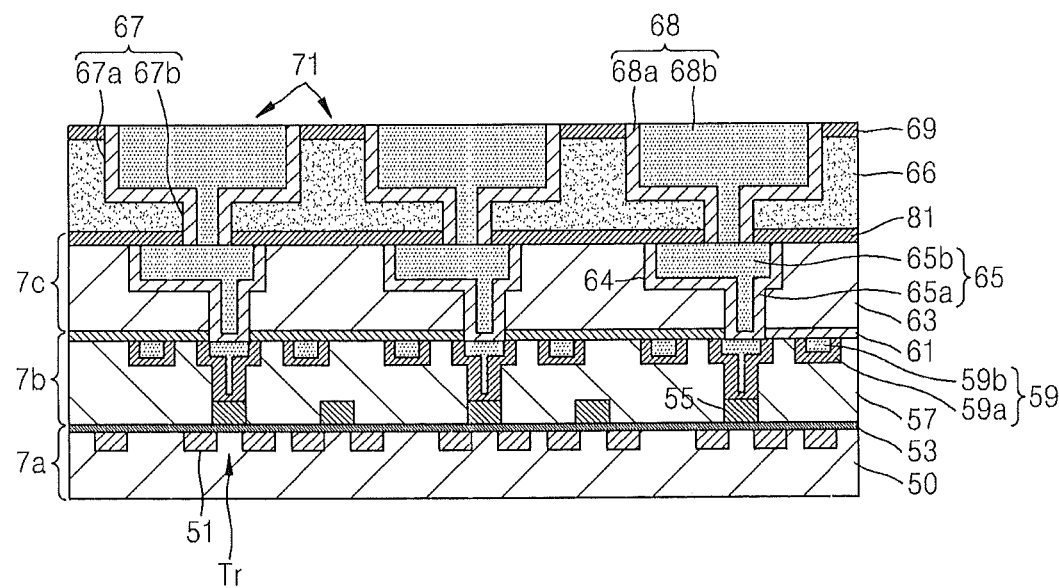

FIGS. 7A to 7C are cross-sectional views illustrating operations of manufacturing the second substrate of FIG. 2B.

Referring to FIG. 7A, the second semiconductor layer 7a including the source/drain regions 51 is formed on the semiconductor substrate 50 using operations illustrated in FIGS. 4A and 4B. Continuously, the first interlayer insulating film 57 is formed on the semiconductor substrate 50 to cover the gate electrodes 55.

Next, the first groove patterns 58 are formed in the first interlayer insulating film 57. Next, the first buried wiring lines 59 are formed of the first barrier metal films 59a and the first metal films 59b in the first groove patterns 58. The first diffusion barrier film 61 is formed on the first interlayer insulating film 57 and the first buried wiring lines 59 so that the second gate wiring layer 7b is completed.

Continuously, a second interlayer insulating film 63 is formed on the first diffusion barrier film 61. Second groove patterns 64 are formed in the second interlayer insulating film 63. Second buried wiring lines 65 are formed of the second barrier metal films 65a and the second metal films 65b in the second groove patterns 64 using the dual damascene process. A second diffusion barrier film 81 is formed on the second interlayer insulating film 63 and the second buried wiring lines 65 so that the second intermediate wiring layer 7c is completed.

Referring to FIG. 7A again, the third interlayer insulating film 66 and the second adhesive insulating film 69 are formed on the second diffusion barrier film 81. Continuously, the second adhesive insulating film 69 and the third interlayer insulating film 66 are patterned so that the third groove patterns 67 that expose the second buried wiring lines 65 are formed. The third groove patterns 67 may be formed of wide groove patterns 67a and narrow groove patterns 67b.

Referring to FIGS. 7B and 7C, third barrier metal films 68a are formed in the third groove patterns 67 and third metal films 68b are formed on the third barrier metal films 68a to bury the third groove patterns 67.

Continuously, as illustrated in FIG. 7C, the third metal films 68b and the third barrier metal films 68a are etched by using the second adhesive insulating film 69 as the etch stop point. By doing so, the second electrodes 68 are formed in the third groove patterns 67 of the third interlayer insulating film 66. The second electrodes 68 are formed of the third barrier metal films 68a and the third metal films 68b. The second electrodes 68 are formed as mixed electrodes of via electrodes formed in the narrow groove patterns 67b and plane electrodes formed in the wide groove patterns 67a using the dual damascene process.

As described above, the second adhesive insulating film 69 form a second adhesive surface 71 that contacts the first substrate 2 and prevents/reduces diffusion of the metal material that forms the second electrodes 68. In addition, the second electrodes 68 form the second adhesive surface 71 that contacts the first substrate 2. The second adhesive surface 71 may provide a relatively flat surface. The flat surface may desirably provide roughness and/or flatness on the order of 0 Å. In one embodiment, the flat surface may have roughness of no more than 5 Å and flatness of no more than 70 Å.

Figure 8:
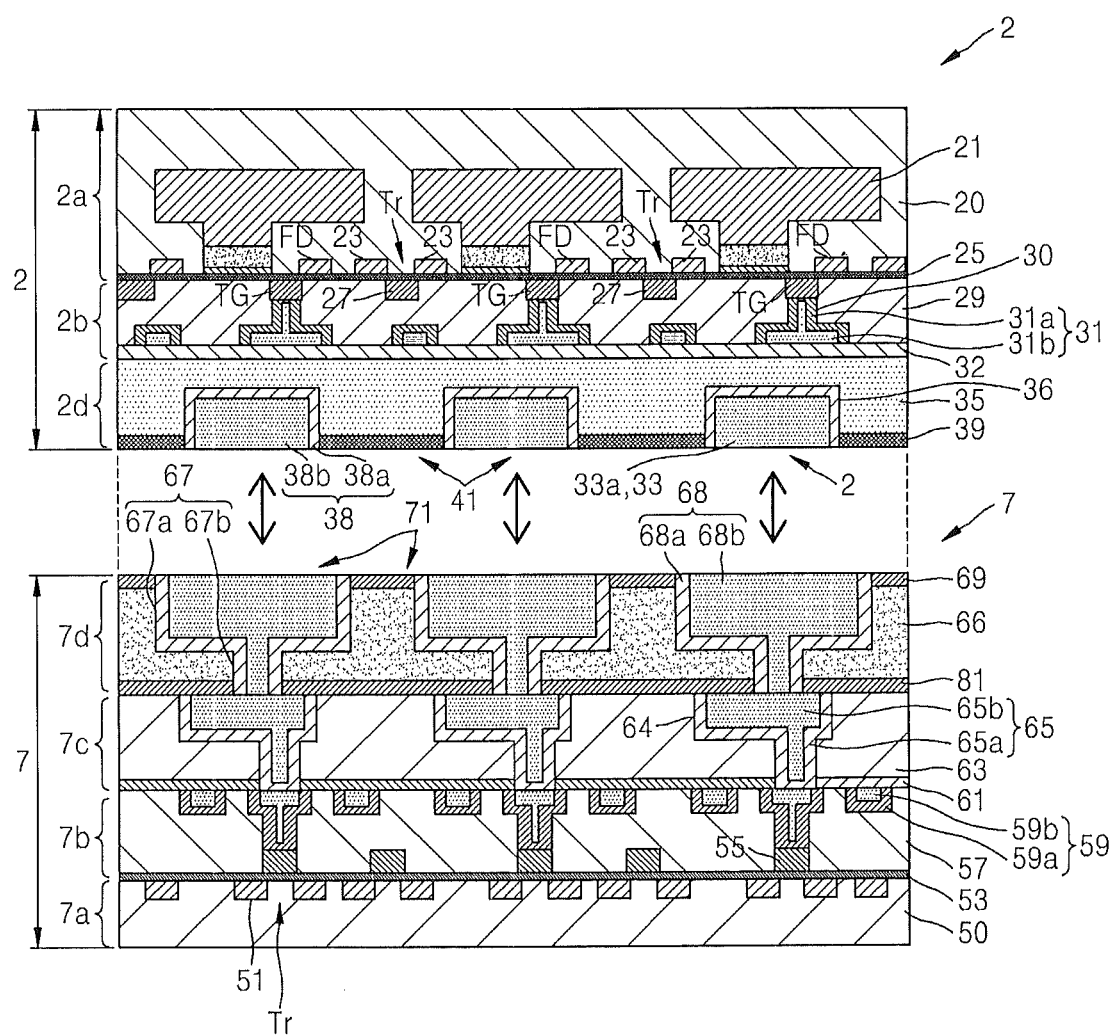
FIG. 8 is a cross-sectional view illustrating adhesion operations of FIGS. 6C and 7C.

FIG. 8 is a cross-sectional view illustrating adhesion operations of FIGS. 6C and 7C.

Specifically, a structure obtained by reversing the structure of FIG. 6C so that the first electrode layer 2d is positioned in the lowermost part is placed on the second electrode layer 7d of FIG. 7C. Accordingly, in the first electrode layer 2d, the first electrodes 38 and the first adhesive insulating film 39 that covers the peripheries of the first electrodes 38 form the first adhesive surface 41 for the second substrate 7 on the first substrate 2. The first adhesive surface 41 may be the flat surface.

In the second electrode layer 7d, the second electrodes 68 and the second adhesive insulating film 69 that covers the peripheries of the second electrodes 68 form the second adhesive surface 71 for the first substrate 2 on the second substrate 7. The second adhesive surface 71 may be the flat surface. The first adhesive surface 41 and the second adhesive surface 71 are made face each other so that the first substrate 2 and the second substrate 7 are adhered. Adhesion between the first substrate 2 and the second substrate 7 will be described in greater detail below.

Since the first adhesive insulating film 39 and the second adhesive insulating film 69 form the adhesive surfaces 41 and 71, the first adhesive insulating film 39 and the second adhesive insulating film 69 may be formed of a material having high adhesive strength and reliability and low adhesive defect and substrate warpage. In addition, the first adhesive insulating film 39 and the second adhesive insulating film 69 may prevent/reduce diffusion of the material that forms the first electrodes 38 and the second electrodes 68. In addition, the adhesive insulating films 39 and 69 provide reduced RC delay. The first adhesive insulating film 39 and the second adhesive insulating film 69 may be formed of the material that provides the above-described characteristics.

After adhering the first substrate 2 and the second substrate 7, the rear surface of the first substrate may be etched to be thinned. Then, the protective film 15, the color filter layer 17, and the lenses 19 may be formed on the rear surface of the first substrate 2 as illustrated in FIG. 2B.

Structure of Stack Type Image Sensors according to Third Embodiments

Figure 9:
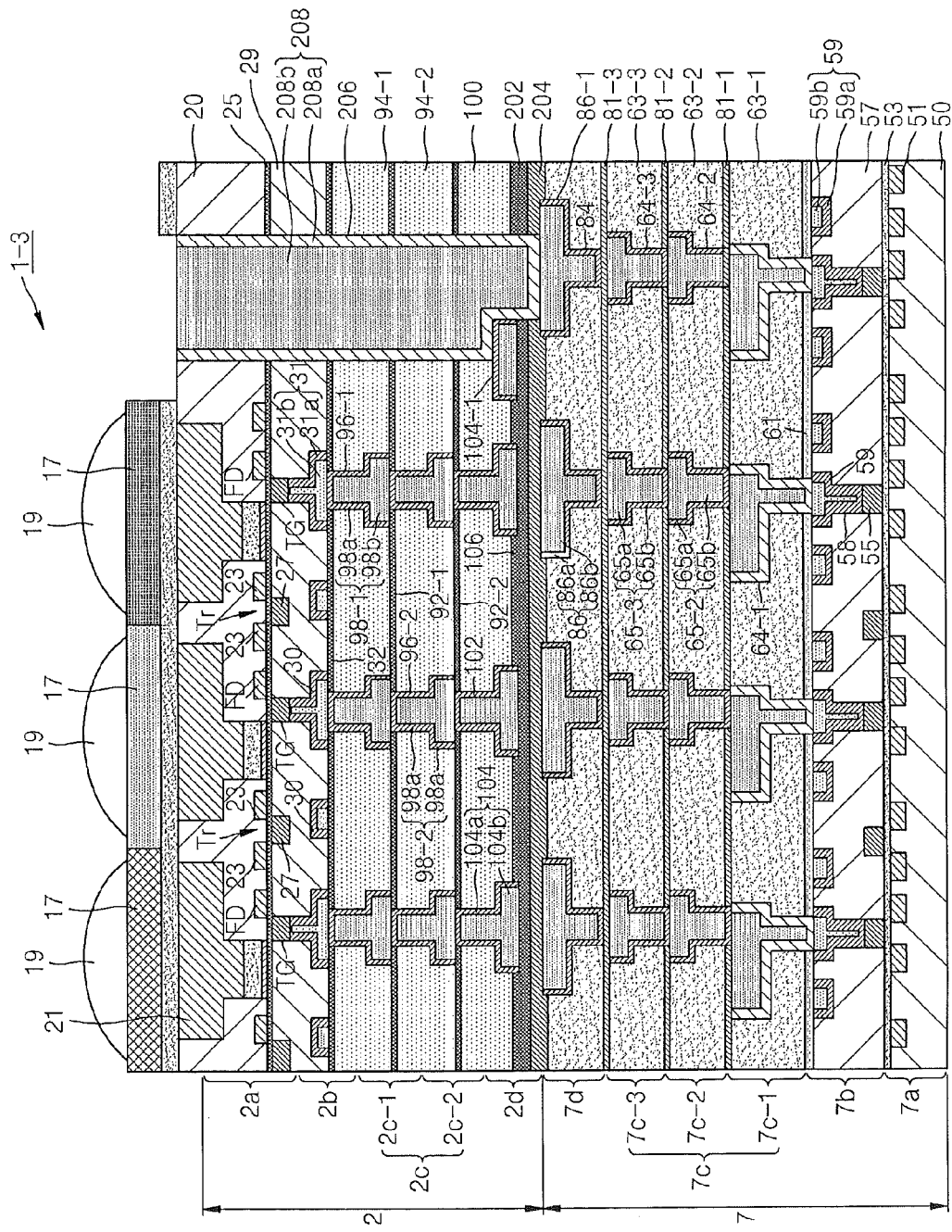
FIG. 9 is a cross-sectional view illustrating elements of a stack type image sensor according to third embodiments of inventive concepts.

FIG. 9 is a cross-sectional view illustrating elements of a stack type image sensor according to third embodiments of inventive concepts.

Specifically, the stack type image sensor 1-3 according to third embodiments of FIG. 9 is the same as the stack type image sensor 1-1 of FIG. 2A excluding structures of the first electrode layer 2d of the first substrate 2, the second electrode layer 7d of the second substrate 7, and a contact and connection relationship between the first electrode layer 2d and the second electrode layer 7d.

The first substrate 2 is formed of the first semiconductor layer 2a on which the device elements that form the pixel circuit are formed, the first gate wiring layer 2b arranged on the first semiconductor layer 2a, the first intermediate wiring layer 2c arranged on the first gate wiring layer 2b, and the first electrode layer 2d formed in the uppermost part like in FIG. 2A.

The second substrate 7 is formed of the second semiconductor layer 7a on which the device elements of the logic circuit for driving the pixel circuit are formed, the second gate wiring layer 7b arranged on the second semiconductor layer 7a, the second intermediate wiring layer 7c arranged on the second gate wiring layer 7b, and the second electrode layer 7d formed in the uppermost part.

The stack type image sensor 1-3 of FIG. 9 is formed by adhering the first substrate 2 and the second substrate 7 as discussed above with respect to FIG. 2A. A first adhesive insulating film 202 is formed to cover peripheries and top of first electrodes 104 and 104-1 formed on the first electrode layer 2d of the first substrate 2. A second adhesive insulating film 204 is formed to cover peripheries and top of second electrodes 86 and 86-1 formed on the second electrode layer 7d of the second substrate 7. The first adhesive insulating film 202 and the second adhesive insulating film 204 are films corresponding to reference numerals 106 and 88 of FIG. 2A, respectively.

The first adhesive insulating film 202 of the first substrate 2 and the second adhesive insulating film 204 of the second substrate 7 are adhered. The first adhesive insulating film 202 forms a first adhesive surface and the second adhesive insulating film 204 forms a second adhesive surface. In the stack type image sensor 1-3 of FIG. 9, the adhesive surfaces are formed of only the first adhesive insulating film 202 and the second adhesive insulating film 204.

Accordingly, when the first adhesive insulating film 202 and the second adhesive insulating film 204 are formed of the above-described material, it is possible to improve adhesive strength and reliability between the first adhesive insulating film 202 and the second adhesive insulating film 204. As described above, the first adhesive insulating film 202 and the second adhesive insulating film 204 may be formed of the same films as those corresponding to reference numerals 106 and 88 of FIG. 2A.

In addition, in the stack type image sensor 1-3 of FIG. 9, the first electrode 104-1 is further formed on one side of the first electrode layer 2d and the second electrode 86-1 is further formed on one side of the second electrode layer 7d for electrical connection between the first substrate 2 and the second substrate 7. The first electrode 104-1 may be connected to the second electrode 86-1 using a through electrode 208 formed in a through hole 206 that passes through the first semiconductor layer 2a, the first gate wiring layer 2b, the first intermediate wiring layer 2c, the first electrode layer 2d, the first adhesive insulating film 202, and the second adhesive insulating film 204. The through electrode 208 may be formed of a barrier metal film 208a and a metal film 208b. The barrier metal film 208a may be formed of Ta or TaN. The metal film 208b may be formed of copper (Cu) or aluminium (Al).

Structure of Stack Type Image Sensors according to Fourth Embodiments

Figure 10:
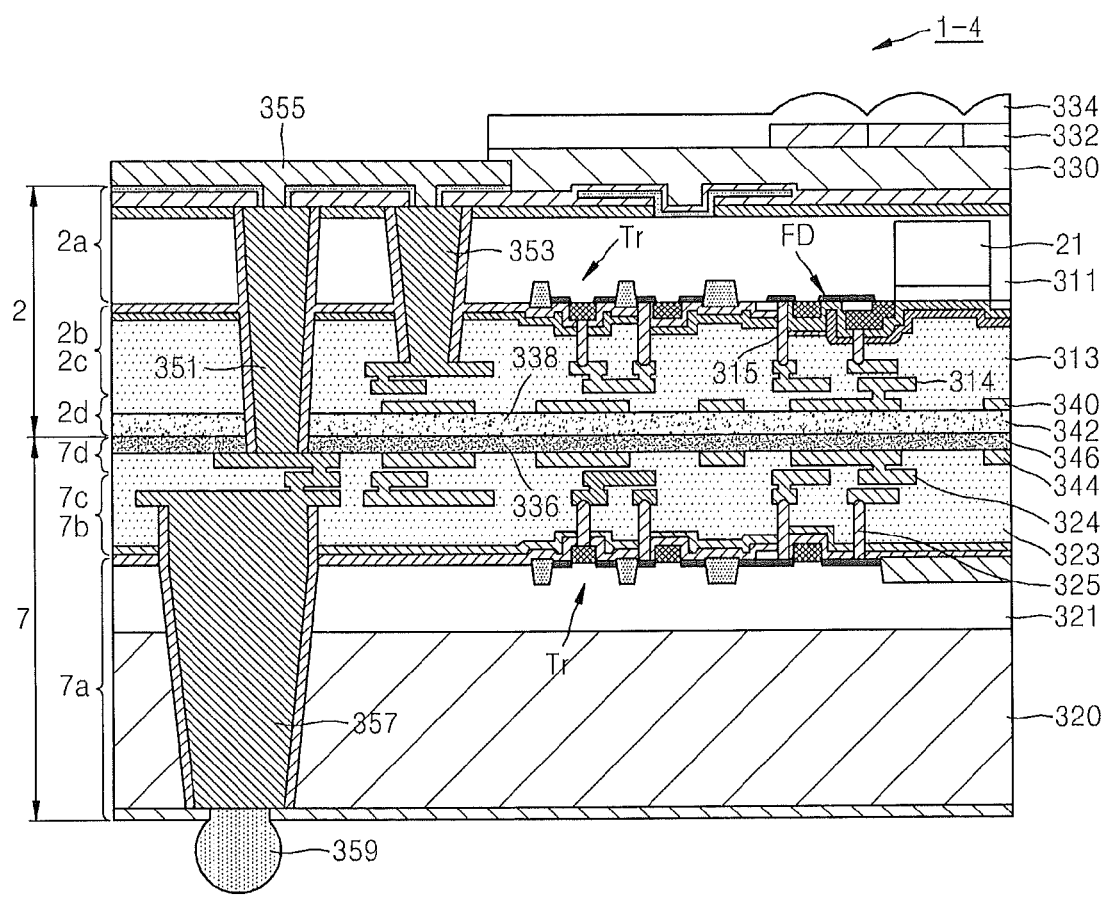
FIG. 10 is a cross-sectional view illustrating elements of a stack type image sensor according to fourth embodiments of inventive conceptst.

FIG. 10 is a cross-sectional view illustrating elements of a stack type image sensor according to fourth embodiments of inventive concepts.

Specifically, the stack type image sensor 1-4 according to fourth embodiments is formed by adhering the first substrate 2 including the device elements that form the pixel circuit and the second substrate 7 including the logic circuit. A protective film 330, a color filter 332, and a microphone lens 334 are stacked on a surface of the first substrate 2 opposite to the second substrate 7.

The first substrate 2 may include the first semiconductor layer 2a, the first gate and intermediate wiring layers 2b and 2c, and the first electrode layer 2d. A semiconductor well region 311 is formed in the first semiconductor layer 2a. The photoelectric conversion regions 21 and floating diffusion FD that form the pixel circuit are formed in the semiconductor well region 311.

The transistor Tr that forms the pixel circuit is formed in the first gate and intermediate wiring layers 2b and 2c. A plurality of internal wiring lines 314 and 315 are formed in the first gate and intermediate wiring layers 2b and 2c through an interlayer insulating film 313. In the first electrode layer 2d, a first adhesive insulating film 342 is formed to cover tops and peripheries of first electrodes 340.

The second substrate 7 may include the second semiconductor layer 7a, the second gate and intermediate wiring layers 7b and 7c, and the second electrode layer 7d. In the second semiconductor layer 7a, a semiconductor well region 321 is formed on a substrate 320. The transistor Tr that forms the logic circuit is formed in the second gate and intermediate wiring layers 7b and 7c. A plurality of internal wiring lines 324 and 325 are formed in the second gate and intermediate wiring layers 7b and 7c through an interlayer insulating film 323. In the second electrode layer 7d, a second adhesive insulating film 346 is formed to cover tops and peripheries of second electrodes 344.

The first adhesive insulating film 342 of the first substrate 2 and the second adhesive insulating film 346 of the second substrate 7 are adhered. The first adhesive insulating film 342 forms a first adhesive surface and the second adhesive insulating film 346 forms a second adhesive surface. In the stack type image sensor 1-4 of FIG. 10, the adhesive surfaces are formed of only the first adhesive insulating film 342 and the second adhesive insulating film 346.

Accordingly, when the first adhesive insulating film 342 and the second adhesive insulating film 346 are formed of the above-described material, it is possible to improve adhesive strength and reliability between the first adhesive insulating film 342 and the second adhesive insulating film 346. As described above, the first adhesive insulating film 342 and the second adhesive insulating film 346 may be formed of the same films as those corresponding to reference numerals 106 and 88 of FIG. 2A.

In addition, in the stack type image sensor 1-4 of FIG. 10, for electrical connection between the first substrate 2 and the second substrate 7, a first through electrode 351 that passes through the first semiconductor layer 2a, the first gate and intermediate wiring layers 2b and 2c, and the first electrode layer 2d of the first substrate 2 may be connected to the internal wiring layer 324 of the second substrate 7. A first partial through electrode 353 connected to the internal wiring layer 314 may be formed in the first substrate 2.

The first through electrode 351 and the first partial through electrode 353 may be connected by using a conductive layer 355 on one side of the first substrate 2. The first through electrode 351 may be connected to a second partial through electrode 357 of the second substrate 7 and the second partial through electrode 357 may be connected to an external connection terminal 359.

Adhesive Structure between Electrode Layers of Stack Type Image Sensor

FIGS. 11A to 11E are cross-sectional views illustrating an adhesive relationship between electrode layers of a stack type image sensor according to embodiments of inventive concepts.

Specifically, FIGS. 11A to 11E are cross-sectional views in which the adhesive surfaces where the first electrode layer 2d of the first substrate 2 and the second electrode layer 7d of the second substrate 7 are adhered are formed to face each other. In FIGS. 11A to 11E, reference numerals 401 and 407 denote interlayer insulating films, reference numerals 411 and 405 denote diffusion barrier films, reference numerals 403a and 409a denote barrier metal films, reference numerals 403b and 409b denote metal films, reference numerals 408 and 408-1 denote first adhesive insulating films, and reference numerals 406 and 406-1 denote second adhesive insulating films. The interlayer insulating films 401 and 407, the diffusion barrier films 411 and 405, and the adhesive insulating films 406, 406-1, 408, and 408-1 may be formed of the same films as the above-described films.

Figure 11A:
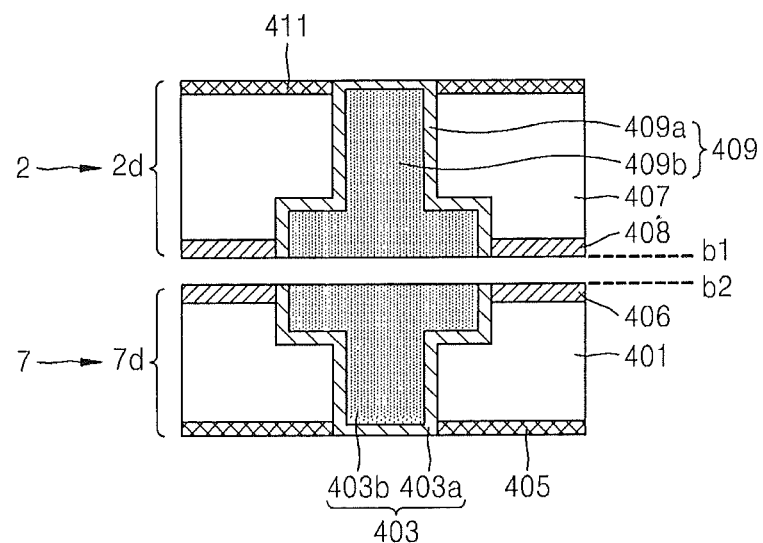
FIGS. 11A to 11E are cross-sectional views illustrating an adhesive relationship between electrode layers of a stack type image sensor according to inventive concepts.
Figure 11B:
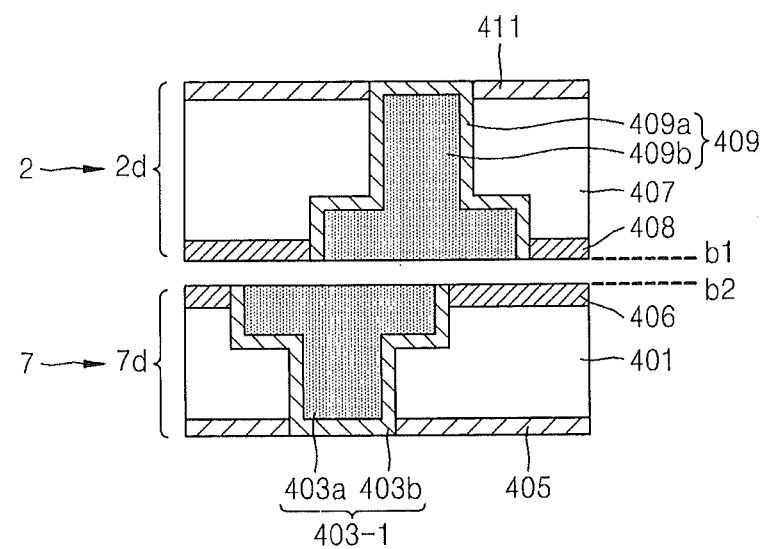
Figure 11C:
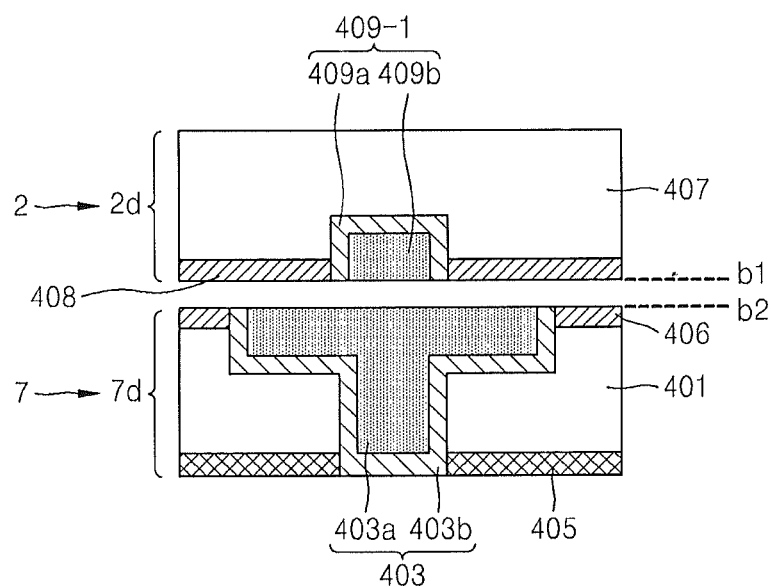

In FIGS. 11A to 11C, the first adhesive insulating film 408 and first electrodes 409 and 409-1 of the first substrate 2 form a first adhesive surface b1 and the second adhesive insulating film 406 and second electrodes 403 and 403-1 of the second substrate 7 form a second adhesive surface b2. In FIGS. 11A and 11B, the first electrodes 409 and 409-1 and the second electrodes 403 and 403-1 may be mixed electrodes of plane electrodes and via electrodes and may be formed by adhering adhesive surfaces between the plane electrodes. In FIG. 11B, the first electrode 409 and the second electrode 403-1 are adhered to go across in a vertical direction. In FIG. 11C, a width of the second electrode 403 is larger than that of the first electrode 409-1.

Figure 11D:
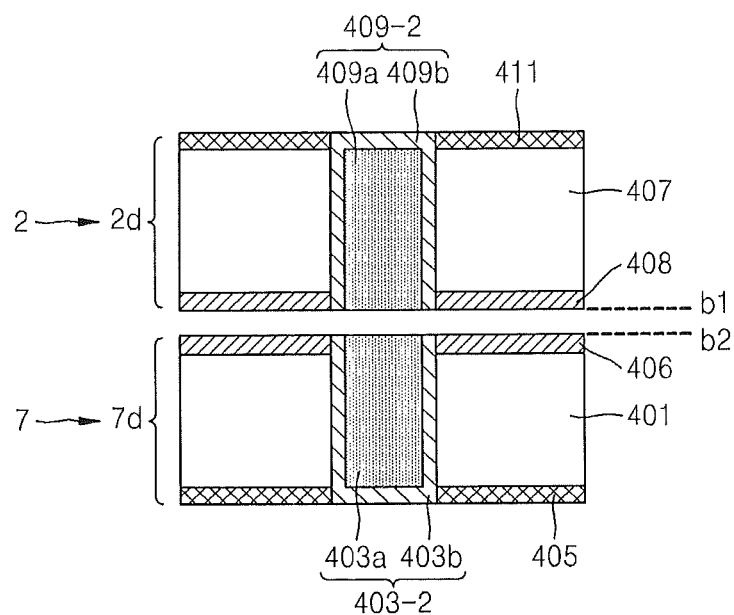
Figure 11E:
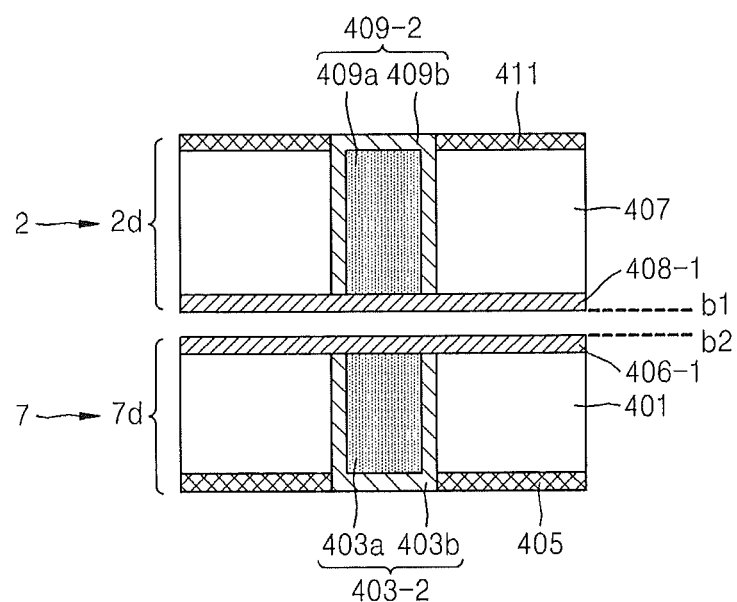

In FIG. 11D, the first adhesive insulating film 408 and a first electrode 409-2 of the first substrate 2 form the first adhesive surface b1 and the second adhesive insulating film 406 and a second electrode 403-2 of the second substrate 7 form the second adhesive surface b2. In FIG. 11E, the first adhesive insulating film 408-1 of the first substrate 2 forms the first adhesive surface b1 and the second adhesive insulating film 406-1 of the second substrate 7 forms the second adhesive surface b2.

The electrode layers 2d and 7d of the stack type image sensors according to embodiments of inventive concepts are connected in any type. When the electrode layers 2d and 7d are adhered by only the adhesive insulating films 406-1 and 408-1 as illustrated in FIG. 11E, as described above, the electrode layers 2d and 7d may be connected using the additional through electrodes 208 of FIGS. 9 or 351, 353, and 357 of FIG. 10.

Operations of Manufacturing Stack Type Image Sensors

Figure 12:
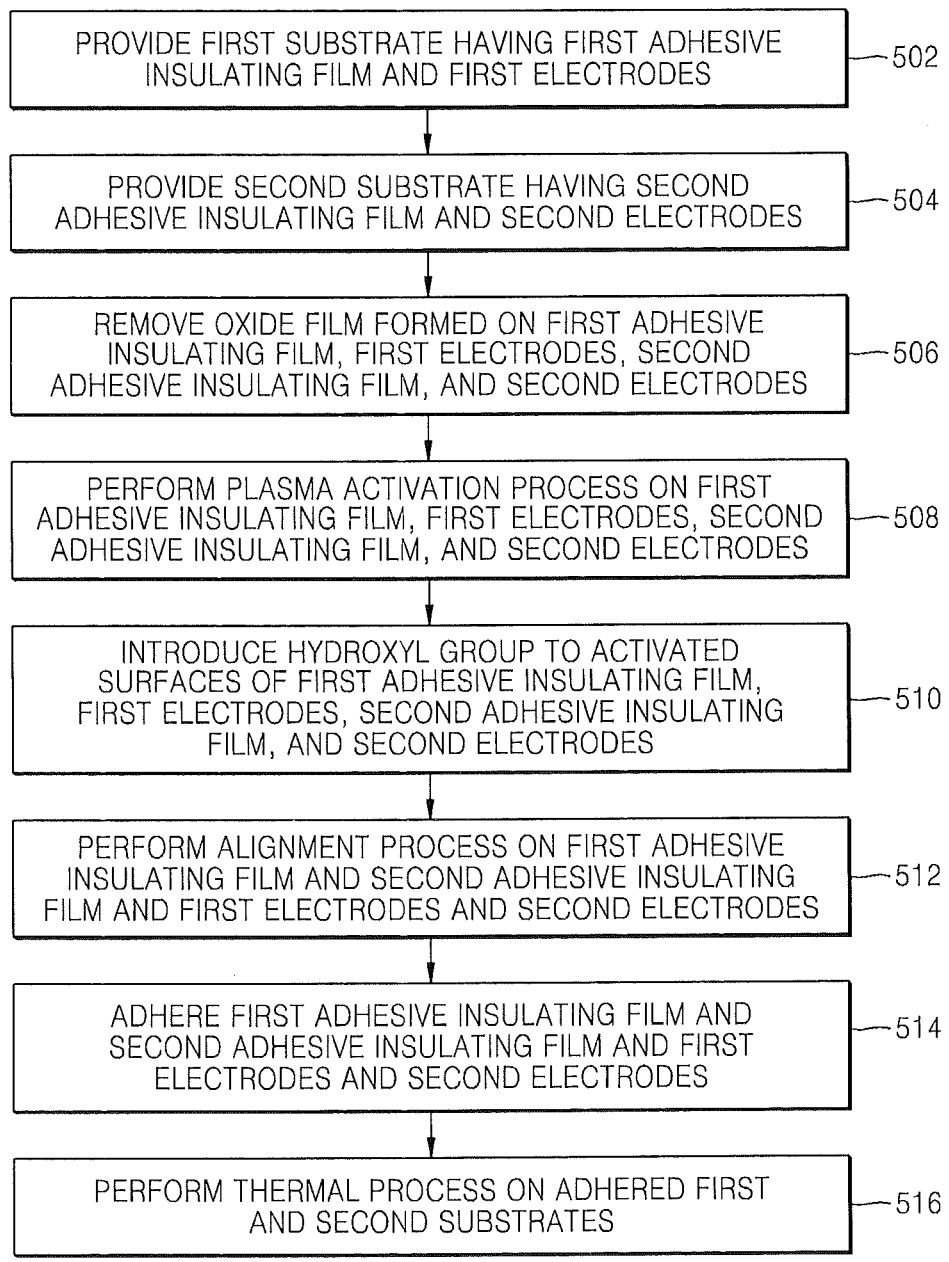
FIG. 12 is a flowchart illustrating embodiments of operations of manufacturing stack type image sensors according to inventive concepts.

FIG. 12 is a flowchart illustrating operations of manufacturing stack type image sensors according to embodiments of inventive concepts. FIGS. 13A to 13D are cross-sectional views illustrating operations of manufacturing a stack type image sensor of FIG. 12. In FIGS. 13A to 13D, only uppermost parts of the first substrate 2 and the second substrate 7 are illustrated for the sake of convenience.

Figure 13A:
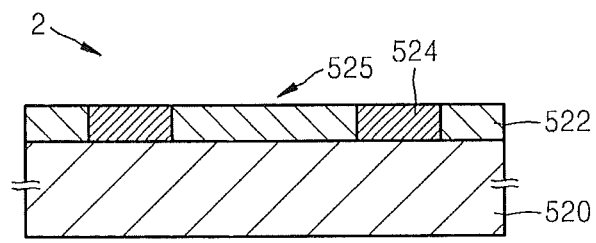
FIGS. 13A to 13C are cross-sectional views illustrating operations of manufacturing a stack type image sensor of FIG. 12.

Specifically, as illustrated in FIG. 13A, the first substrate 2 having a first adhesive insulating film 522 and first electrodes 524 formed on a first interlayer insulating film 520 is provided in operation 502. On the first substrate 2, like in FIGS. 1, 2A, 2B, 9, and 10, the device elements (not shown) that form the pixel circuit may be formed. The first adhesive insulating film 522 may be formed to cover peripheries of the first electrodes 524. The first adhesive insulating film 522 is formed of the same film as the adhesive insulating films illustrated in FIGS. 1, 2A, 2B, 9, and 10, The first electrodes 524 may be formed using the damascene process. The first electrodes 524 may be formed of a metal such as Cu or Al. The first adhesive insulating film 522 and the first electrodes 524 form a first adhesive surface 525. The first adhesive surface 525 may provide a relatively flat surface. The flat surface may desirably provide roughness and flatness on the order of 0 Å. In one embodiment, the flat surface may have roughness of no more than 5 Å and flatness of no more than 70 Å.

Figure 13B:
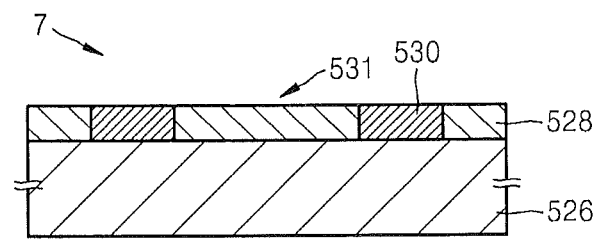

As illustrated in FIG. 13B, the second substrate 7 having a second adhesive insulating film 528 and second electrodes 530 formed on a second interlayer insulating film 526 is provided in operation 504. On the second substrate 7, like in FIGS. 1, 2A, 2B, 9, and 10, the device elements (not shown) of the logic circuit for driving the pixel circuit may be formed. The second adhesive insulating film 528 may be formed to cover peripheries of the second electrodes 530.

The second adhesive insulating film 528 is formed of the same film as the adhesive insulating films illustrated in FIGS. 1, 2A, 2B, 9, and 10. The second electrodes 530 may be formed using the damascene process. The second electrodes 530 may be formed of a metal such as Cu or Al. The second adhesive insulating film 528 and the second electrodes 530 form a second adhesive surface 531. The second adhesive surface 531 may provide a relatively flat surface. The flat surface may desirably provide roughness and flatness on the order of 0 Å. In one embodiment, the flat surface may have roughness of no more than 5 Å and flatness of no more than 70 Å.

An oxide film formed on the first adhesive insulating film 522 and/or the first electrodes 524 of the first substrate 2 and an oxide film formed on the second adhesive insulating film 528 and the second electrodes 530 are washed to be removed in operation 506.

A plasma activation process is performed on the first adhesive insulating film 522 and the first electrodes 524 of the first substrate 2 and the plasma activation process is performed on the second adhesive insulating film 528 and the second electrodes 530 of the second substrate 7 in operation 508.

In the plasma activation process, the first substrate 2 and the second substrate 7 are positioned in a plasma chamber in a predetermined gas atmosphere, for example, nitrogen, hydrogen, and argon. Bias voltages are applied to the upper and lower electrodes, respectively, based on the first substrate 2 or the second substrate 7 so that surfaces of the first adhesive insulating film 522 and the first electrodes 524 or surfaces of the second adhesive insulating film 528 and the second electrodes 530 are activated in a plasma atmosphere. That is, the first adhesive surface 525 and/or the second adhesive surface 531 are activated by the plasma activation process.

A hydroxyl group is introduced to the activated surfaces of the first adhesive insulating film 522 and the first electrodes 524 or the second adhesive insulating film 528 and the second electrodes 530 through pure washing in operation 510. The hydroxyl group is introduced to the activated surfaces of the first adhesive insulating film 522 and the first electrodes 524 or the second adhesive insulating film 528 and the second electrodes 530 to more easily perform a subsequent adhesion process.

Figure 13C:
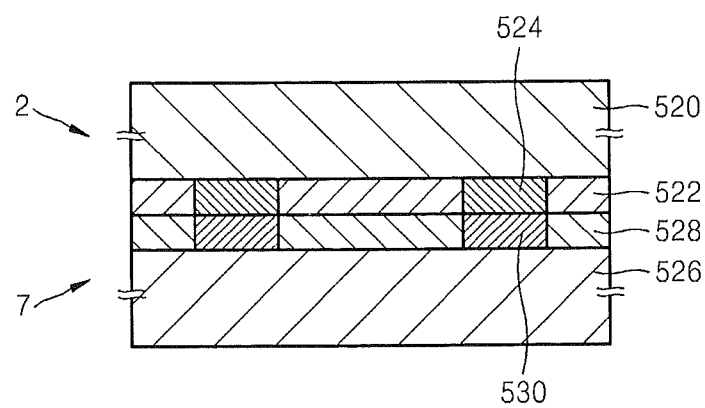

As illustrated in FIG. 13C, an alignment process and the adhesion process are performed on the first adhesive insulating film 522 and the first electrodes 524 of the first substrate 2 and the second adhesive insulating film 528 and the second electrodes 530 of the second substrate 7 in operations 512 and 514. After the first adhesive insulating film 522 and the first electrodes 524 of the first substrate 2 are aligned on the second adhesive insulating film 528 and the second electrodes 530 of the second substrate 7 so that the first adhesive insulating film 522 and the first electrodes 524 of the first substrate 2 face the second adhesive insulating film 528 and the second electrodes 530 of the second substrate 7 in operation 512, the second adhesive insulating film 528 and the first adhesive insulating film 522 are adhered, and the second electrodes 530 and the first electrodes 524 are adhered in operation 514.

Post thermal processing is performed on the adhered first and second substrates 2 and 7 in operation 516. The post thermal processing is performed to improve adhesive strength of the adhered first and second substrates 2 and 7.

Figure 14:
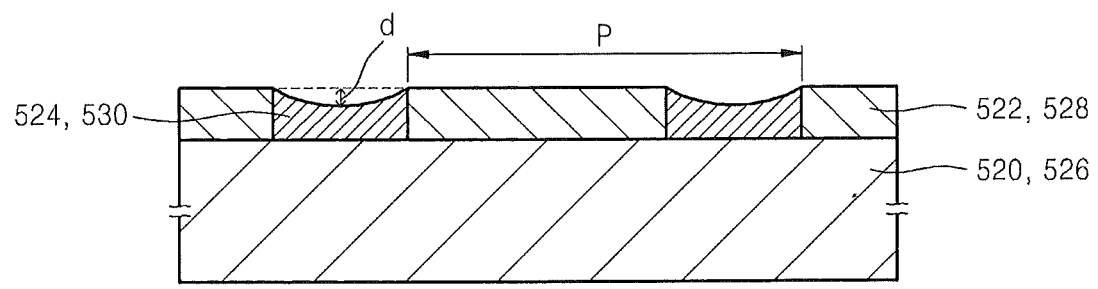
FIG. 14 is a cross-sectional view.
Figure 15:
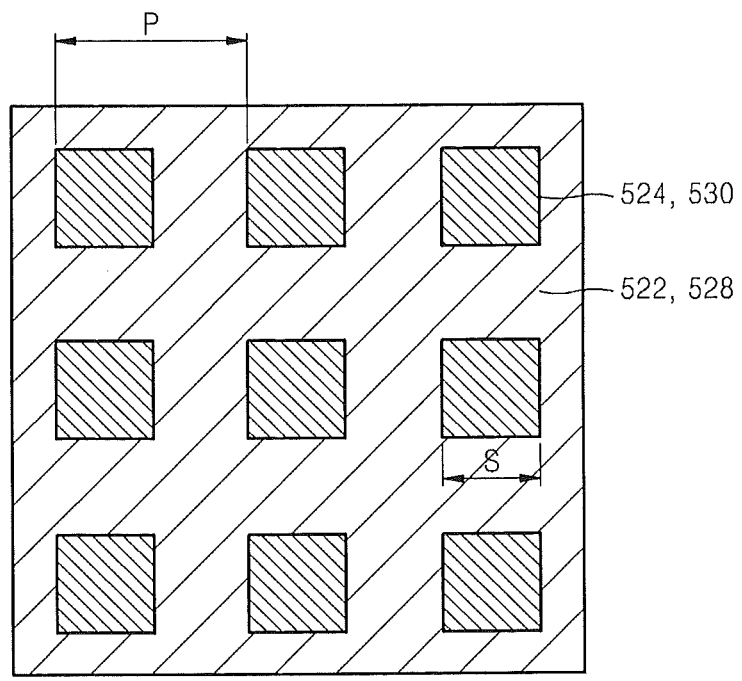
FIG. 15 is a plan view.
Figure 16:
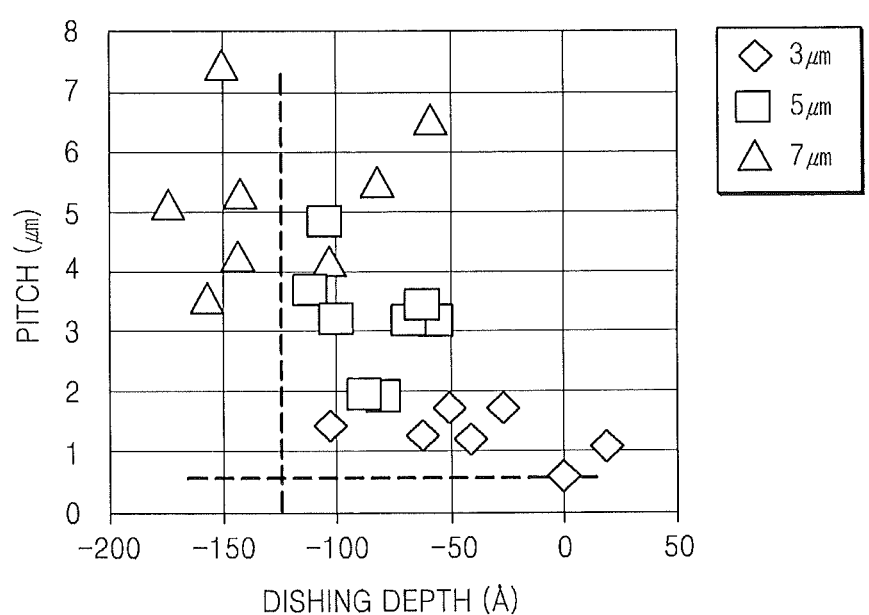
FIG. 16 is a graph illustrating dishing depths in accordance with pitches and sizes of electrodes when the first and second electrodes of FIGS. 13A to 13C are formed.

FIG. 14 is a cross-sectional view, FIG. 15 is a plan view, and FIG. 16 is a graph illustrating dishing depths in accordance with pitches and sizes of electrodes when the first and second electrodes of FIG. 13 are formed.

Specifically, FIG. 14 is a cross-sectional view of elements illustrating that, when metal films for electrodes are etched by using the adhesive insulating films 522 and 528 of FIG. 13 as etch stop films so that the first electrodes 524 and the second electrodes 530 are formed, the first electrodes 524 and the second electrodes 530 are dished. FIG. 15 is a plan view of elements of FIG. 14. As illustrated in FIG. 14, when the first electrodes 524 and the second electrodes 530 are dished, an adhesive surface is not flat.

In FIGS. 14 and 15, a dishing depth is represented as d, a pitch is represented as P, and a size of the electrodes 524 and 530 is represented as S. In FIG. 16, when the dishing depth has a minus value, it means that the first electrodes 524 and the second electrodes 530 are dished below (or recessed below) top surfaces of the adhesive insulting films 522 and 528, and when the dishing depth has a plus value, it means that the first electrodes 524 and the second electrodes 530 protrude above the top surfaces of the adhesive insulting films 522 and 528.

As illustrated in FIG. 16, the larger the pitch P and the size S of the electrodes, the larger the dishing depth d. As a result of several experiments, it is noted that dishing depths d that do not significantly affect adhesion between the first substrate 2 and the second substrate 7 may be is no more than 120 Å, for example, 0 to 120 Å pitches P that do not significantly+ affect adhesion between the first substrate 2 and the second substrate 7 may be no more than 5 μm, for example, 0.5 to 5 μm; and sizes S of electrodes that do not significantly affect adhesion between the first substrate 2 and the second substrate 7 may be no more than 5 μm, for example, 1 to 5 μm.

Figure 17:
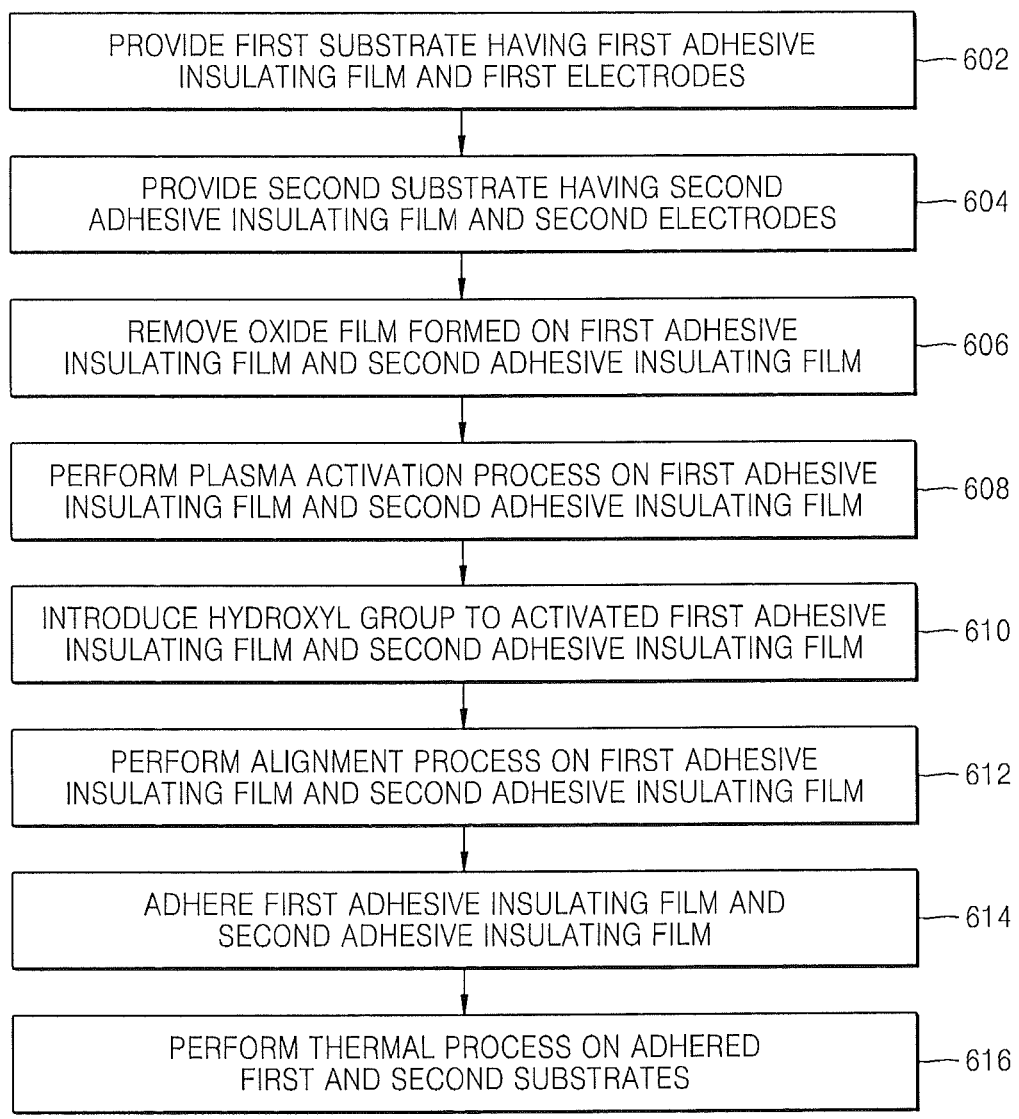
FIG. 17 is a flowchart illustrating embodiments of operations of manufacturing stack type image sensors according to inventive concepts.
Figure 18A:
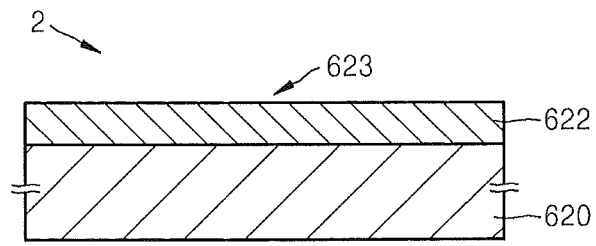
FIGS. 18A to 18C are cross-sectional views illustrating operations of manufacturing a stack type image sensor of FIG. 17.
Figure 18B:
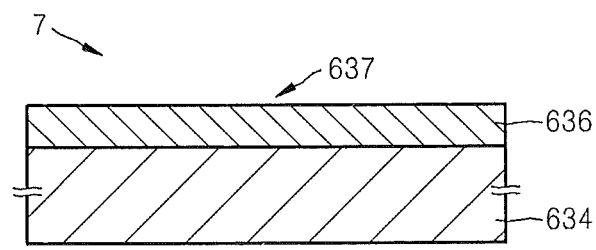
Figure 18C:
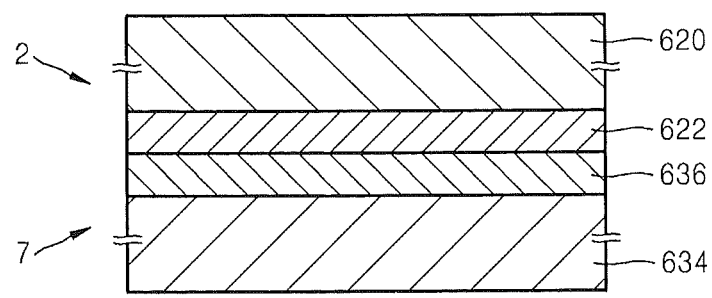

FIG. 17 is a flowchart illustrating embodiments of operations manufacturing a stack type image sensor according to embodiments of inventive concepts FIGS. 18A to 18C are cross-sectional views illustrating operations of manufacturing a stack type image sensor of FIG. 17. FIGS. 18A to 18C illustrate only the uppermost parts of the first substrate 2 and the second substrate 7 for the sake of convenience.

Operations of manufacturing the stack type image sensor of FIGS. 17 and 18 are the same as operations of manufacturing the stack type image sensor of FIGS. 12 and 13 except that electrodes are not formed in the uppermost parts of the first and second substrates.

As illustrated in FIG. 18A, the first substrate 2 having a first adhesive insulating film 622 formed on a first interlayer insulating film 620 is provided in operation 602. On the first substrate 2, the device elements (not shown) that form the pixel circuit may be formed. The first adhesive insulating film 622 is formed of the same film as the adhesive insulating films illustrated in FIGS. 1, 2A, 2B, 9, and 10. The first adhesive insulating film 622 forms a first adhesive surface 623. The first adhesive surface 623 may be a flat surface.

As illustrated in FIG. 18B, the second substrate 7 having a second adhesive insulating film 636 formed on a second interlayer insulating film 634 is provided in operation 604. On the second substrate 7, the device elements (not shown) of the logic circuit for driving the pixel circuit may be formed. The second adhesive insulating film 636 is formed of the same film as the adhesive insulating films illustrated in FIGS. 1, 2A, 2B, 9, and 10. The second adhesive insulating film 636 forms a second adhesive surface 637. The second adhesive surface 637 may be a relatively flat surface.

An oxide film formed on the first adhesive insulating film 622 of the first substrate 2 and an oxide film formed on the second adhesive insulating film 636 of the second substrate 7 are removed by washing in operation 606.

The plasma activation process is performed on the first adhesive insulating film 622 of the first substrate 2 and the plasma activation process is performed on the second adhesive insulating film 636 of the second substrate 7 in operation 608. In the plasma activation process, the first substrate 2 and the second substrate 7 are positioned in a plasma chamber in a predetermined gas atmosphere, for example, nitrogen, hydrogen, and argon and bias voltages are applied to the upper and lower electrodes, respectively, based on the first substrate 2 or the second substrate 7 so that a surface of the first adhesive insulating film 622 or a surface of the second adhesive insulating film 636 are activated in a plasma atmosphere. That is, the first adhesive surface 623 and the second adhesive surface 637 are activated by the plasma activation process.

A hydroxyl group is introduced to the activated surface of the first adhesive insulating film 622 or the second adhesive insulating film 636 through pure washing in operation 610. The hydroxyl group is introduced to the activated surface of the first adhesive insulating film 622 or the second adhesive insulating film 636 to easily perform a subsequent adhesion process.

As illustrated in FIG. 18C, an alignment process and the adhesion process are performed on the first adhesive insulating film 622 of the first substrate 2 and the second adhesive insulating film 636 of the second substrate 7 in operations 612 and 614. After the first adhesive insulating film 622 of the first substrate 2 is aligned on the second adhesive insulating film 636 of the second substrate 7 so that the first adhesive insulating film 622 of the first substrate 2 faces the second adhesive insulating film 636 of the second substrate 7 in operation 612, the second adhesive insulating film 636 and the first adhesive insulating film 622 are adhered in operation 614.

Post thermal processing is performed on the adhered first and second substrates 2 and 7 in operation 616. The post thermal processing is performed to improve adhesive strength of the adhered first and second substrates 2 and 7.

Figure 19:
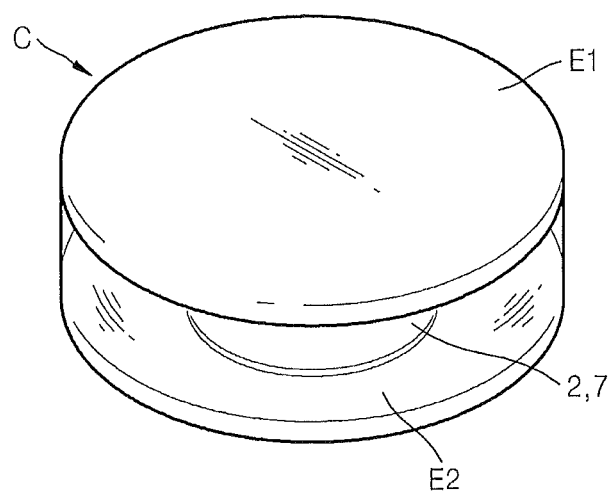
FIG. 19 is a schematic view illustrating plasma activation processes of FIG. 17.

FIG. 19 is a schematic view illustrating the plasma activation process of FIG. 17, FIGS. 20 to 22 are graphs illustrating degrees of adhesion between a first substrate and a second substrate in accordance with kinds, voltages, and exposure times of plasma during the plasma activation processes of FIGS. 13 and 17.

FIG. 19 illustrates that the first substrate 2 or the second substrate 7 is positioned in a plasma chamber C. An upper terminal E1 and a lower terminal E2 are provided in the plasma chamber C.

Figure 20:
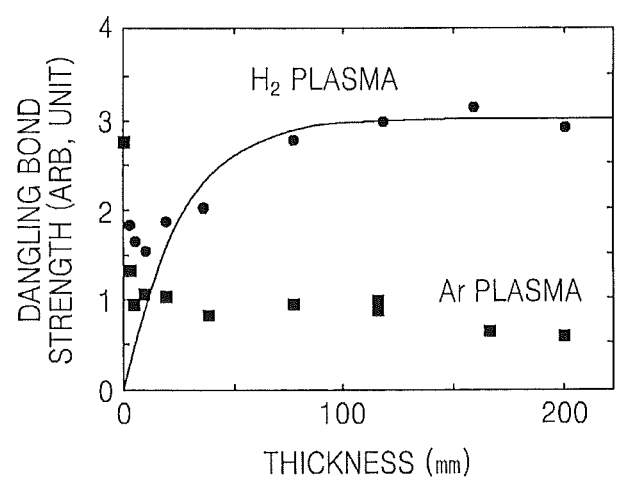
FIGS. 20 to 22 are graphs illustrating degrees of adhesion between a first substrate and a second substrate in accordance with kinds, voltages, and exposure times of plasma during plasma activation processes of FIGS. 13A, 13B, 13C, and 17.

FIG. 20 illustrates a relationship between a thickness of an adhesive insulating film and dangling bond strength in accordance with kinds of plasma formed in a plasma chamber, for example, argon and hydrogen plasma. In the case of the hydrogen plasma, when the thickness of the adhesive insulating film increases, the dangling bond strength increases. In the case of the argon plasma, although the thickness of the adhesive insulating film increases, the dangling bond strength does not increase. It is also noted that the dangling bond strength is greater when the hydrogen plasma is used than when the argon plasma is used. In the case of nitrogen plasma, dangling bond strength similar to that of the argon plasma may be obtained.

Figure 21:
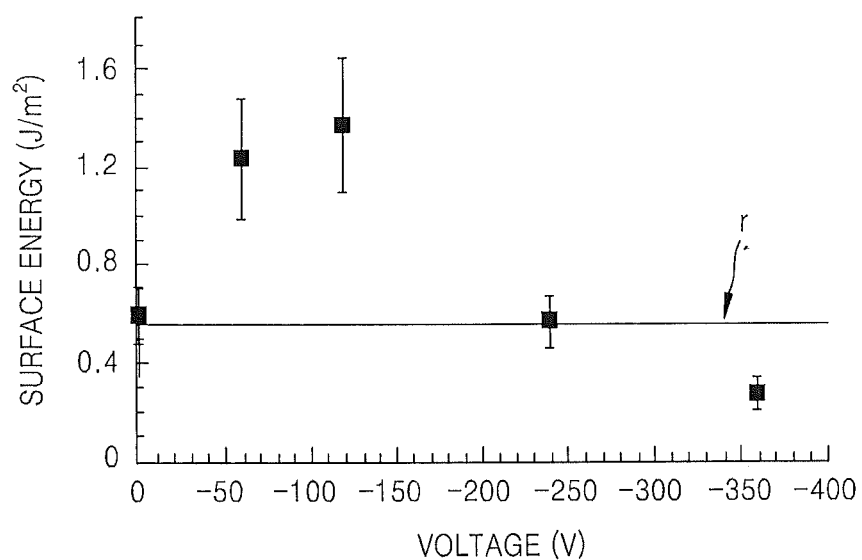

FIG. 21 illustrates surface energy of an adhesive insulating film in accordance with a voltage difference between an upper terminal and lower terminal of a plasma chamber.

In FIG. 21, reference numeral r denotes surface energy in which adhesive insulating films may be adhered, for example, 0.6 (J/m$^2$). As illustrated in FIG. 21, surface energy is high when the voltage difference between the upper terminal and lower terminal of the plasma chamber is no more than 250V, for example, in the range of 60 to 120V.

Figure 22:
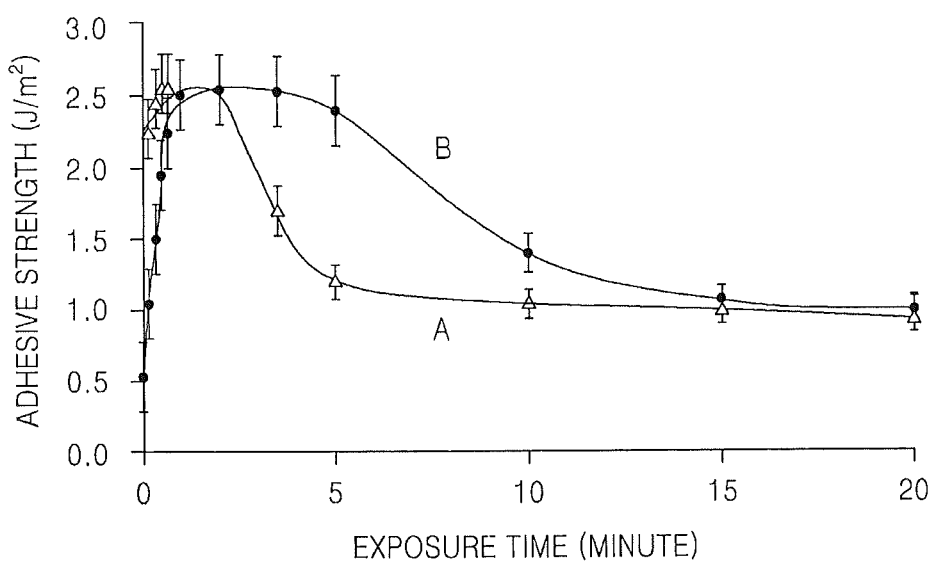

FIG. 22 illustrates adhesion strengths between adhesive insulating films in accordance with plasma exposure times. In FIG. 22, A represents a case in which the adhesive insulating films are exposed to the above-described plasma and B represents a case in which the adhesive insulating films are exposed to radical. As illustrated in FIG. 22, the adhesive strengths are reduced after five minutes of exposure times.

Application Example of a Stack Type Image Sensor

Figure 23:
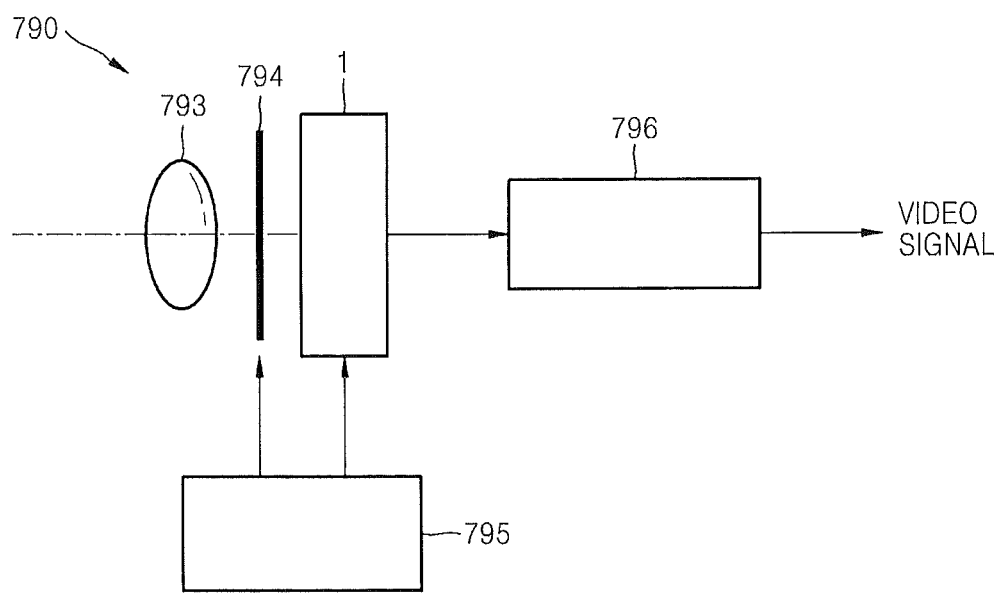
FIG. 23 is a block diagram illustrating a camera using a stack type image sensor according to inventive concepts.

FIG. 23 is a block diagram illustrating a camera by using a stack type image sensor according to embodiments of inventive concepts.

Specifically, a camera 790 includes a stack type image sensor 1, an optical system 793 to induce incident light to a light receiving sensor of the stack type image sensor 1, a shutter 794, a driving circuit 795 to drive the stack type image sensor 1, and a signal processing circuit 796 to process an output signal of the stack type image sensor 1.

The stack type image sensor 1 may be formed by applying any of the above-described embodiments. The optical system 793 including an optical lens forms an image on an image surface of the stack type image sensor 1 using image light from a subject, that is, incident light. Therefore, signal charges are accumulated in the stack type image sensor 1 for a uniform period.

The optical system 793 may be an optical lens system formed of a plurality of optical lenses. The shutter 794 controls a light irradiation period and an occlusion period of the stack type image sensor 1. The driving circuit 795 supplies a driving signal to the stack type image sensor 1 and the shutter 794 and controls a signal output operation of the signal processing circuit 796 of the stack type image sensor 1 and a shutter operation of the shutter 794 by a supplied driving signal or timing signal.

The driving circuit 795 transmits a signal from the stack type image sensor 1 to the signal processing circuit 796 by supplying the driving signal or timing signal. The signal processing circuit 796 performs various signal processings on the signal transmitted from the stack type image sensor 1. The processed image signal is stored in a memory or is output to a monitor.

Figure 24:
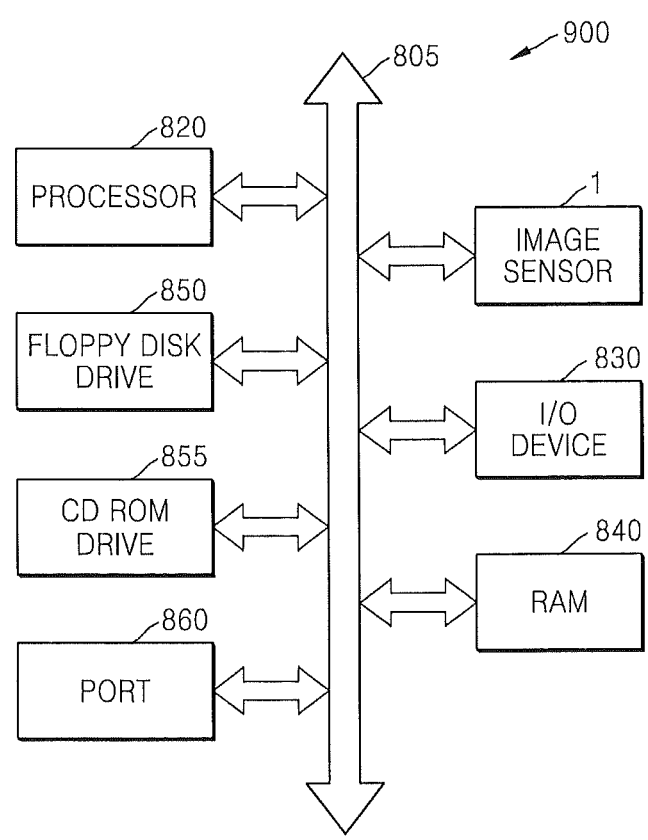
FIG. 24 is a block diagram illustrating imaging systems including stack type image sensors according to embodiments of inventive concepts.

FIG. 24 is a block diagram illustrating an imaging system including a stack type image sensor according to embodiments of inventive concepts.

Specifically, imaging system 900 is provided to process an output image of the above-described stack type image sensor 1. The imaging system 900 may be any kind of electrical and electronic system in which the stack type image sensor 1 is mounted, such as a computer system, a camera system, a scanner, and an image stabilizing system.

The processor based imaging system 900 (such as the computer system) may include a processor 820 such as a microprocessor or a central processing unit (CPU) that may communicate with an input/output device 830 through a bus 805. Through the bus 805, a floppy disk drive 850, a CD read only memory (ROM) drive 855, a port 860, and a random access memory (RAM) 840 are connected to the processor 820 to transmit and receive data and to reproduce an output image for the data of the stack type image sensor 1.

The port 860 may couple a video card, a sound card, a memory card, and a universal serial bus (USB) device or may communicate with other systems. The stack type image sensor 1 may be integrated together with processors such as the CPU, a digital signal processor (DSP), or the microprocessor and may be integrated with the memory. The stack type image sensor 1 may be integrated with the processor by an additional chip. The imaging system 900 may be a system block diagram of a camera phone or a digital camera among recently developing digital devices.

According to some embodiments, interlayer insulating film 57 and/or interlayer insulating film 323 may include a layer of a dielectric material having a relatively low dielectric constant, such as a dielectric constant less than 2.4. Interlayer insulating film 57 and/or interlayer insulating film 323, for example, may include a layer of polyimide (PI), polynorbornene, benzocyclobutene, polytetrafluoroethylene (PTFE), poly aryl ether (PAE), polysilsesquioxane, hydrogen silsesquioxane (HSQ), and/or methylsilsesquioxane (MSQ).

As appreciated by the present inventive entity, devices and methods of forming devices according to various embodiments described herein may be embodied in microelectronic devices such as integrated circuits, wherein a plurality of devices according to various embodiments described herein are integrated in the same microelectronic device. Accordingly, the cross-sectional view(s) illustrated herein may be replicated in two different directions, which need not be orthogonal, in the microelectronic device. Thus, a plan view of the microelectronic device that embodies devices according to various embodiments described herein may include a plurality of the devices in an array and/or in a two-dimensional pattern that is based on the functionality of the microelectronic device.

The devices according to various embodiments described herein may be interspersed among other devices depending on the functionality of the microelectronic device. Moreover, microelectronic devices according to various embodiments described herein may be replicated in a third direction that may be orthogonal to the two different directions, to provide three-dimensional integrated circuits.

Accordingly, the cross-sectional view(s) illustrated herein provide support for a plurality of devices according to various embodiments described herein that extend along two different directions in a plan view and/or in three different directions in a perspective view. For example, when a single active region is illustrated in a cross-sectional view of a device/structure, the device/structure may include a plurality of active regions and transistor structures (or memory cell structures, gate structures, etc., as appropriate to the case) thereon, as would be illustrated by a plan view of the device/structure.

While inventive concepts have been particularly shown and described with reference to embodiments thereof, it will be understood that various changes in form and details may be made therein without departing from the spirit and scope of the following claims.

What is claimed is:

1. An electronic device comprising:
   a first semiconductor layer;
   a first electrode layer on the semiconductor layer, wherein the first electrode layer includes a first plurality of electrodes;
   an adhesive insulating layer on the first electrode layer, wherein the first electrode layer is between the adhesive insulating layer and the first semiconductor layer, wherein the adhesive insulating layer comprises at least one of silicon oxycarbon nitride (SiOCN), silicon boron nitride (SiBN), and/or boron nitride (BN);
   a second electrode layer on the adhesive insulating layer, wherein the second electrode layer includes a second plurality of electrodes, and wherein the adhesive insulating layer is between the first and second electrode layers; and
   a second semiconductor layer wherein the second electrode layer is between the adhesive insulating layer and the second semiconductor layer, and wherein the adhesive insulating layer is between the first and second semiconductor layers.

2. The electronic device of claim 1 wherein the electronic device comprises an image sensor, wherein the first semiconductor layer includes a plurality of pixel sensors therein, wherein the electrodes of the first plurality of electrodes are coupled with respective pixel sensors of the plurality of pixel sensors, wherein the electrodes of the second plurality of electrodes are coupled with respective electrodes of the first plurality of electrodes, wherein the second semiconductor layer includes a plurality of electronic circuits thereon, and wherein electronic circuits of the plurality of electronic circuits are coupled with respective pixel sensors of the plurality of pixel sensors through respective electrodes of the first and second pluralities of electrodes.

3. The electronic device of claim 1 wherein the adhesive insulating layer comprises silicon oxycarbon nitride (SiOCN).

4. The electronic device of claim 1 wherein the adhesive insulating layer comprises first and second adhesive insulating layers, and wherein the first adhesive insulating layer is between the first electrode layer and the second adhesive insulating layer.

5. The electronic device of claim 4 wherein the first adhesive insulating layer comprises a silicon oxycarbon nitride (SiOCN) layer, a silicon boron nitride (SiBN) layer, and/or a boron nitride (BN) layer, and wherein the second adhesive insulating layer comprises a silicon oxycarbon nitride (SiOCN) layer, a silicon boron nitride (SiBN) layer, a boron nitride (BN) layer, a silicon carbon nitride (SiCN) layer, and/or a silicon carbide (SiC) layer.

6. The electronic device of claim 4 wherein a first electrode of the first plurality of electrodes extends through an opening in the first adhesive insulating layer, wherein a second electrode of the second plurality of electrodes extends through an opening in the second adhesive insulating layer, wherein the opening in the second adhesive insulating layer is larger than the opening in the first adhesive insulating layer, and wherein the first and second openings are aligned so that the first and second electrodes are electrically coupled.

7. The electronic device of claim 6 wherein the first adhesive insulating layer is between portions of the second electrode and the first semiconductor layer.

8. The electronic device of claim 6 wherein the first and second electrodes are electrically coupled at respective first and second interface surfaces thereof, and wherein a surface area of the second interface surface of the second electrode is greater than a surface area of the first interface surface of the first electrode.

9. The electronic device of claim 1 wherein the electrodes of the second plurality of electrodes are electrically coupled with the electrodes of the first plurality of electrodes through respective openings through the adhesive insulating layer.

10. The electronic device of claim 1 wherein the first electrode layer comprises a first interlayer insulating layer between the adhesive insulating layer and the first semiconductor layer, wherein each of the electrodes of the first plurality of electrodes is provided through a respective opening through the first interlayer insulating layer, wherein the second electrode layer comprises a second interlayer insulating layer between the adhesive insulating layer and the second semiconductor layer, and wherein each of the electrodes of the second plurality of electrodes is provided through a respective opening through the second interlayer insulating layer.

11. The electronic device of claim 10 further comprising:
a third interlayer insulating layer between the second semiconductor layer and the second electrode layer, wherein the third interlayer insulating layer comprises a dielectric material having a dielectric constant less than 2.4.

12. The electronic device of claim 1 further comprising:
an electrically conductive through silicon via extending through the first semiconductor layer, the first electrode layer, and the adhesive insulating layer, wherein the electrically conductive through silicon via provides electrical coupling between one of the first plurality of electrodes and one of the second plurality of electrodes.

13. An electronic device comprising:
a first semiconductor layer;
a first electrode layer on the semiconductor layer, wherein the first electrode layer includes a first plurality of electrodes;
an adhesive insulating layer on the first electrode layer, wherein the first electrode layer is between the adhesive insulating layer and the first semiconductor layer, wherein the adhesive insulating layer comprises a layer of silicon oxycarbon nitride (SiOCN);
a second electrode layer on the adhesive insulating layer, wherein the second electrode layer includes a second plurality of electrodes, and wherein the adhesive insulating layer is between the first and second electrode layers; and
a second semiconductor layer wherein the second electrode layer is between the adhesive insulating layer and the second semiconductor layer, and wherein the adhesive insulating layer is between the first and second semiconductor layers.

14. The electronic device of claim 13 wherein the electronic device comprises an image sensor, wherein the first semiconductor layer includes a plurality of pixel sensors therein, wherein the electrodes of the first plurality of electrodes are coupled with respective pixel sensors of the plurality of pixel sensors, wherein the electrodes of the second plurality of electrodes are coupled with respective electrodes of the first plurality of electrodes, wherein the second semiconductor layer includes a plurality of electronic circuits thereon, and wherein electronic circuits of the plurality of electronic circuits are coupled with respective pixel sensors of the plurality of pixel sensors through respective electrodes of the first and second pluralities of electrodes.

15. The electronic device of claim 13 wherein the adhesive insulating layer comprises first and second adhesive insulating layers, and wherein the first adhesive insulating layer is between the first electrode layer and the second adhesive insulating layer.

16. The electronic device of claim 15 wherein the first adhesive insulating layer comprises a silicon oxycarbon nitride (SiOCN) layer, and wherein the second adhesive insulating layer comprises a silicon oxycarbon nitride (SiOCN) layer, a silicon boron nitride (SiBN) layer, a boron nitride (BN) layer, a silicon carbon nitride (SiCN) layer, and/or a silicon carbide (SiC) layer.

17. The electronic device of claim 15 wherein a first electrode of the first plurality of electrodes extends through an opening in the first adhesive insulating layer, wherein a second electrode of the second plurality of electrodes extends through an opening in the second adhesive insulating layer, wherein the opening in the second adhesive insulating layer is larger than the opening in the first adhesive insulating layer, and wherein the first and second openings are aligned so that the first and second electrodes are electrically coupled.

18. The electronic device of claim 17 wherein the first adhesive insulating layer is between portions of the second electrode and the first semiconductor layer.

19. The electronic device of claim 17 wherein the first and second electrodes are electrically coupled at respective first and second interface surfaces thereof, wherein a surface area of the second interface surface of the second electrode is greater than a surface area of the first interface surface of the first electrode.

20. An electronic device comprising:
a first semiconductor layer;
a first electrode layer on the first semiconductor layer, wherein the first electrode layer includes a first plurality of electrodes;
a first adhesive insulating layer on the first electrode layer wherein the first electrode layer is between the first adhesive insulating layer and the first semiconductor layer wherein a first electrode of the first plurality of electrodes extends through an opening in the first adhesive insulating layer;
a second adhesive insulating layer on the first adhesive insulating layer wherein the first adhesive insulating layer is between the second adhesive insulating layer and the first semiconductor layer;
a second electrode layer on the second adhesive insulating layer, wherein the second electrode layer includes a second plurality of electrodes, wherein the second adhesive insulating layer is between the first adhesive insulating layer and the second electrode layer, wherein a second electrode of the second plurality of electrodes extends through an opening in the second adhesive insulating layer, wherein the opening in the first adhesive insulating layer is larger than the opening in the second adhesive insulating layer, and wherein the openings in the first and second adhesive insulating layers are aligned so that the first and second electrodes are electrically coupled; and
a second semiconductor layer wherein the second electrode layer is between the adhesive insulating layer and the second semiconductor layer.

* * * * *